United States Patent
Matsuda et al.

(10) Patent No.: US 7,485,162 B2
(45) Date of Patent: Feb. 3, 2009

(54) POLISHING COMPOSITION

(75) Inventors: Tsuyoshi Matsuda, Kasugai (JP); Tatsuhiko Hirano, Kakamigahara (JP); Junhui Oh, Inuyama (JP); Atsunori Kawamura, Owariasahi (JP); Kenji Sakai, Nagoya (JP)

(73) Assignee: Fujimi Incorporated, Nishikasugai-Gun, Aichi (JP)

( * ) Notice: Subject to any disclaimer, the term of this patent is extended or adjusted under 35 U.S.C. 154(b) by 393 days.

(21) Appl. No.: 10/952,672

(22) Filed: Sep. 29, 2004

(65) Prior Publication Data

US 2005/0108949 A1   May 26, 2005

(30) Foreign Application Priority Data

| Sep. 30, 2003 | (JP) | 2003-342530 |
| Sep. 30, 2003 | (JP) | 2003-342531 |
| Oct. 10, 2003 | (JP) | 2003-352952 |
| Nov. 25, 2003 | (JP) | 2003-394593 |
| Nov. 26, 2003 | (JP) | 2003-396171 |

(51) Int. Cl.
*B24D 3/02* (2006.01)
*C09C 1/68* (2006.01)
*C09K 3/14* (2006.01)

(52) U.S. Cl. .......... 51/308; 438/691; 438/692; 438/693; 438/645; 252/79.1

(58) Field of Classification Search .......... 51/307, 51/308, 309; 106/3, 5; 216/89; 438/691–693, 438/645; 252/79.1
See application file for complete search history.

(56) References Cited

U.S. PATENT DOCUMENTS

| 5,391,258 | A |   | 2/1995 | Brancaleoni et al. | 216/89 |
| 5,428,721 | A |   | 6/1995 | Sato et al. | 345/650 |
| 5,476,606 | A |   | 12/1995 | Brancaleoni et al. | 252/79.1 |
| 5,575,885 | A |   | 11/1996 | Hirabayashi et al. | 438/14 |
| 5,770,095 | A |   | 6/1998 | Sasaki et al. | 216/38 |
| 5,858,813 | A |   | 1/1999 | Scherber et al. | 438/693 |
| 5,954,997 | A |   | 9/1999 | Kaufman et al. | 252/79.1 |
| 6,126,853 | A |   | 10/2000 | Kaufman et al. | 252/79.1 |
| 6,136,711 | A | * | 10/2000 | Grumbine et al. | 438/692 |
| 6,194,317 | B1 | * | 2/2001 | Kaisaki et al. | 438/692 |
| 6,303,049 | B1 | * | 10/2001 | Lee et al. | 252/79.1 |
| 6,309,560 | B1 | * | 10/2001 | Kaufman et al. | 252/79.1 |
| 6,409,936 | B1 |   | 6/2002 | Robinson et al. | |
| 6,440,186 | B1 |   | 8/2002 | Sakai et al. | 51/308 |
| 6,440,187 | B1 | * | 8/2002 | Kasai et al. | 51/309 |
| 6,458,721 | B2 |   | 10/2002 | Iyer | 438/787 |
| 6,530,968 | B2 | * | 3/2003 | Tsuchiya et al. | 51/307 |
| 6,679,929 | B2 |   | 1/2004 | Asano et al. | 51/308 |

(Continued)

FOREIGN PATENT DOCUMENTS

JP   6-313164   11/1994

(Continued)

*Primary Examiner*—J. A. Lorengo
*Assistant Examiner*—Pegah Parvini
(74) *Attorney, Agent, or Firm*—Vidas, Arrett & Steinkraus

(57) ABSTRACT

A polishing composition of the present invention, to be used in polishing for forming wiring in a semiconductor device, includes: a specific surfactant; a silicon oxide; at least one selected from the group consisting of carboxylic acid and alpha-amino acid; a corrosion inhibitor; an oxidant; and water. This polishing composition is capable of suppressing the occurrence of the dishing.

5 Claims, 2 Drawing Sheets

U.S. PATENT DOCUMENTS

| | | | |
|---|---|---|---|
| 2001/0052587 A1* | 12/2001 | Feeney et al. | 252/79 |
| 2002/0095874 A1 | 7/2002 | Tsuchiya et al. | 51/308 |
| 2002/0096659 A1 | 7/2002 | Sakai et al. | |
| 2002/0111024 A1* | 8/2002 | Small et al. | 438/689 |
| 2002/0173239 A1* | 11/2002 | Hokkirigawa et al. | 451/36 |
| 2003/0040182 A1 | 2/2003 | Hsu et al. | |
| 2003/0051413 A1 | 3/2003 | Sakai et al. | |
| 2003/0073386 A1* | 4/2003 | Ma et al. | 451/41 |
| 2003/0104699 A1* | 6/2003 | Minamihaba et al. | 438/692 |
| 2003/0168627 A1* | 9/2003 | Singh et al. | 252/79.1 |
| 2003/0170991 A1 | 9/2003 | Wang et al. | 438/692 |
| 2003/0196386 A1* | 10/2003 | Hattori et al. | 51/307 |
| 2004/0084414 A1 | 5/2004 | Sakai et al. | |

FOREIGN PATENT DOCUMENTS

| | | |
|---|---|---|
| JP | 11-21546 | 1/1999 |
| JP | 2000-160141 | 6/2000 |
| JP | 2002-75927 | 3/2002 |

* cited by examiner

POLISHING COMPOSITION

BACKGROUND OF THE INVENTION

The present invention relates to a polishing composition to be used, for example, in polishing for forming wiring in a semiconductor device.

A high-integration and high-speed ultra large scale integrated circuit (ULSI) is manufactured in accordance with a fine design rule. Recently, in order to suppress an increase in wiring resistance, caused by finer wiring in a semiconductor device, a copper containing metal has been increasingly used as a wiring material.

Since the copper containing metal has the property of being difficult to process by anisotropic etching, wiring made of the copper containing metal is formed by the Chemical Mechanical Polishing (CMP) process in the following manner.

First, a barrier film made of a compound containing tantalum is provided on an insulating film having trenches. Next, a conductive film made of the copper containing metal is provided on the barrier film so as to at least fill up the trenches. Subsequently, in the first polishing process, part of the portion of the conductive film, which is positioned outside the trenches, is removed by CMP. In the second polishing process, another part of the portion of the conductive film, which is positioned outside the trenches, is removed by CMP so that the top surface of the barrier film is exposed. Finally, in the third polishing process, the residue of the portion of the conductive film, which is positioned outside the trenches, and the portion of the barrier film, which is positioned outside the trenches, are removed by CMP so that the top surface of the insulating film is exposed Consequently, the portion of the conductive film, which is positioned in the trenches, is left on the insulating film and will act as the wiring.

Japanese Laid-Open Patent Publication No. 2000-160141 discloses a first conventional polishing composition, which comprises an abrasive, alpha-alanine, hydrogen peroxide, and water. Japanese Laid-Open Patent Publication No. 11-21546 discloses a second conventional polishing composition, which comprises an abrasive, an oxidant, a complexing agent, such as citric acid, and a film forming agent, such as imidazole. Japanese Laid-Open Patent Publication No. 6-313164 discloses a third conventional polishing composition, which comprises an abrasive comprising aqueous colloidal silica and a polishing accelerator comprising a persulfate. Japanese Laid-Open Patent Publication No. 2002-75927 discloses a fourth conventional polishing composition, which comprises an abrasive having a primary particle diameter of 50 to 120 nm, a compound of alpha-alanine or the like for forming a chelate with a copper ion, a film forming agent, such as benzotriazole, hydrogen peroxide, and water. The abrasive acts to mechanically polish an object to be polished. Alpha-alanine and the complexing agent act to promote polishing of an object to be polished which is made of the copper containing metal.

When each of the first to fourth conventional polishing compositions is used in CMP in the above second polishing process, a phenomenon called dishing occurs, where the level of the top surface of the conductive film lowers. This is thought to be attributed to removal of the conductive films to an excessive degree, due to an excessively high ability of each of the first to fourth conventional polishing compositions to polish the copper containing metal. The dishing reduces the cross sectional area of the wiring, thereby causing an increase in wiring resistance. The dishing also impairs the flatness of the surface of a semiconductor device, thereby making it difficult to form multi-filmed wiring in the semiconductor device.

SUMMARY OF THE INVENTION

Accordingly, it is an object of the present invention to provide a polishing composition resistant to the occurrence of the dishing when used in polishing for forming wiring in a semiconductor device.

To achieve the foregoing and other objectives and in accordance with the purpose of the present invention, a polishing composition is provided. The polishing composition, to be used in polishing for forming wiring in a semiconductor device, includes: a surfactant; a silicon oxide; at least one selected from the group consisting of carboxylic acid and alpha-amino acid; a corrosion inhibitor; an oxidant; and water. The surfactant contains at least one selected from the compounds, each represented by any of general formulas (1) to (7), and the salts thereof.

(1)

In general formula (1), $R^1$ represents an alkyl group having 8 to 16 carbon atoms, $R^2$ represents a hydrogen atom, a methyl group, or an ethyl group, $R^3$ represents an alkylene group having 1 to 8 carbon atoms, $-(CH_2CH_2O)_l-$, $-(CH_2CH(CH_3)O)_m-$, or a combination of at least two of those, l and m are integers of 1 to 8 when $R^3$ represents $-(CH_2CH_2O)_l-$ or $-(CH_2CH(CH_3)O)_m-$. The sum of l and m is 8 or less when $R^3$ represents the combination of $-(CH_2CH_2O)_l-$ and $-(CH_2CH(CH_3)O)_m-$. $X^1$ represents a carboxy group or a sulfone group, $$R^4\text{-}Z\text{-}Y^1\text{-}X^2 \quad (2)$$

$$R^4\text{-}Z\text{-}X^2 \quad (3)$$

In general formulas (2) and (3), $R^4$ represents an alkyl group having 8 to 16 carbon atoms, Z is a functional group represented by chemical formula (i) or (ii), $Y^1$ represents $-(CH_2CH_2O)_n-$, $-(CH_2CH(CH_3)O)_p-$, or the combination of $-(CH_2CH_2O)_n-$ and $-(CH_2CH(CH_3)O)_p-$. n and p are integers of 1 to 6 when $Y^1$ represents $-(CH_2CH_2O)_n-$ or $-(CH_2CH(CH_3)O)_p-$. The sum of n and p is 6 or less when $Y^1$ represents the combination of $-(CH_2CH_2O)_n-$ and $-(CH_2CH(CH_3)O)_p-$. $X^2$ represents a phosphate group or a sulfone group.

(i)

(ii)

(4)

-continued

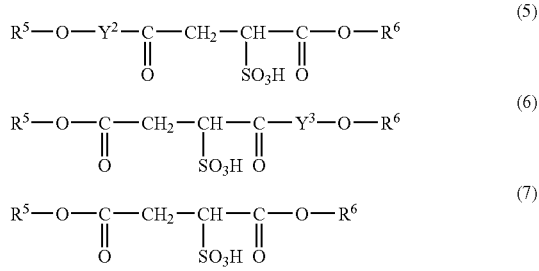

In general formulas (4) to (7), each of $R^5$ and $R^6$ represents a hydrogen atom, a hydroxy group, or an alkyl group having 8 to 16 carbon atoms, each of $Y^2$ and $Y^3$ represents —$(CH_2CH_2O)_q$—, —$(CH_2CH(CH_3)O)_r$—, or the combination of —$(CH_2CH_2O)_q$— and —$(CH_2CH(CH_3)O)_r$—. q and r are integers of 1 to 6 when $Y^2$ or $Y^3$ represents —$(CH_2CH_2O)_q$— or —$(CH_2CH(CH_3)O)_r$—. The sum of q and r is an integer of 6 or less when $Y^2$ or $Y^3$ represents the combination of —$(CH_2CH_2O)_q$— and —$(CH_2CH(CH_3)O)_r$—.

The present invention provides another polishing composition. The polishing composition, to be used in polishing for forming wiring in a semiconductor device, includes: alpha-amino acid; a benzotriazole derivative represented by general formula:

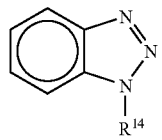

where $R^{14}$ represents an alkyl group having a carboxy group, an alkyl group having a hydroxy group and a tert-amino group, an alkyl group having a hydroxy group, or an alkyl group other than those; a silicon oxide; a surfactant; an oxidant; and water.

The present invention provides still another polishing composition. The polishing composition, to be used in polishing for forming wiring in a semiconductor device, includes: a silicon oxide; at least one selected from the group consisting of carboxylic acid and alpha-amino acid; a corrosion inhibitor; a surfactant; a persulfate; and water. The polishing composition further includes an aluminum ion. The pH of the polishing composition is not less than 7 and less than 12.

The present invention provides yet another polishing composition. The polishing composition, to be used in polishing for forming wiring in a semiconductor device, includes: a first silicon oxide having a 50-percent particle diameter D50 of 60 to 150 nm, which is measured by laser diffraction scattering; a second silicon oxide having a 50-percent particle diameter D50 of 10 to 50 nm, which is measured by laser diffraction scattering; at least one selected from the group consisting of carboxylic acid and alpha-amino acid; a corrosion inhibitor; a surfactant; an oxidant; and water.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawing, in which.

DETAILED DESCRIPTION OF THE PREFERRED EMBODIMENTS

A first embodiment of the present invention will now be described.

Figure 1:
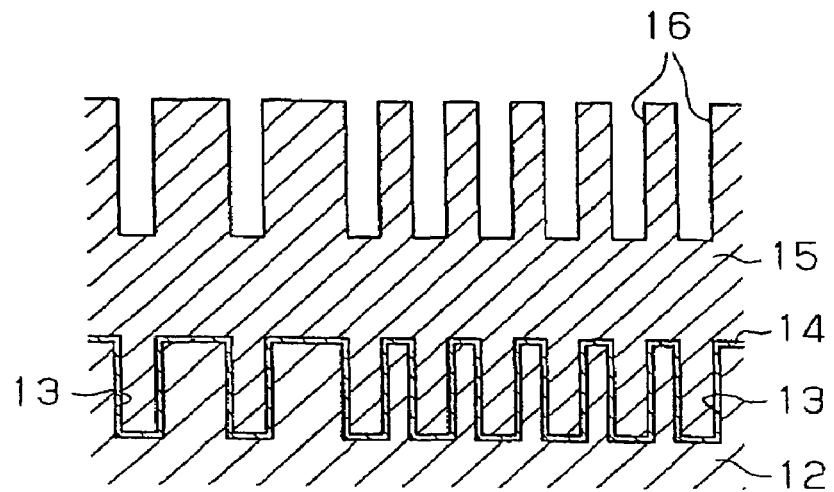
FIG. 1(a) to FIG. 1(d) are cross sectional views for explaining a polishing method according to one embodiment of the present invention.
Figure 1:
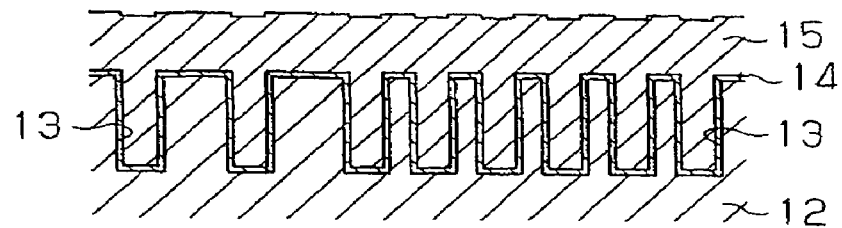
Figure 1:
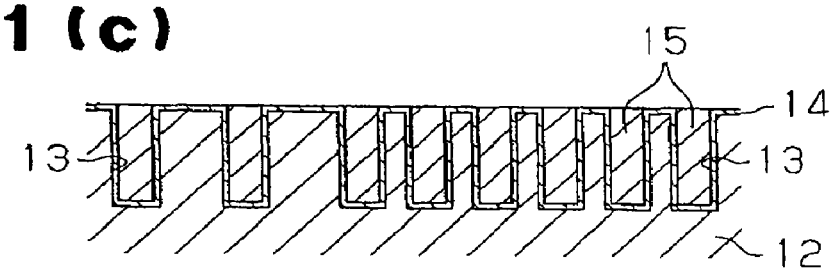
Figure 1:
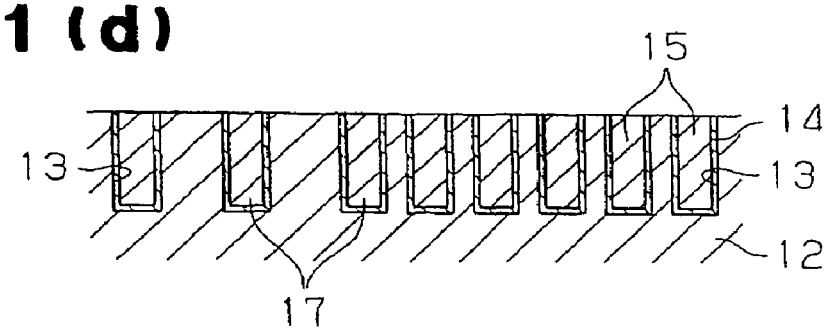

First, a method for forming wiring in a semiconductor device will be described. In forming wiring in a semiconductor device, as shown in FIG. 1(a), a barrier film 14 and a conductive film 15 are first formed on an insulating film 12 having trenches 13.

The insulating film 12 may be a $SiO_2$ film, formed using tetraethoxysilane (TEOS) by the Chemical Vapor Deposition (CVD) method, a SiOF film or SiOC film. The trenches 13 are formed for example by the known lithography and pattern etching techniques so as to have a prescribed design pattern.

The barrier film 14 is formed on the insulating film 12 so as to cover the surface thereof in advance of formation of the conductive film 15. The barrier film 14 is formed, for example, by a sputtering method. It is preferable that the barrier film 14 have a sufficiently small thickness as compared to the depth of the trenches 13. The barrier film 14 is formed for example of tantalum or a tantalum-containing compound, such as tantalum nitride.

The conductive film 15 is provided on the barrier film 14 so as to at least fill up the trenches 13. The conductive film 15 is formed for example by the Physical Vapor Deposition (PVD) method. The conductive film 15 is formed for example of a copper containing metal. The copper containing metal may be copper, a copper-aluminum alloy or a copper-titanium alloy. The conductive film 15 that is formed on the insulating film 12 having the trenches 13 typically comprises, on the top surface, initial concave portions 16 to correspond to the trenches 13.

Next, as shown in FIG. 1(b), in the first polishing process, part of the portion of the conductive film 15, which is positioned outside the trenches 13, is removed by CMP. Subsequently, as shown in FIG. 1(c), in the second polishing process, another part of the portion of the conductive film 15, which is positioned outside the trenches 13, is removed by CMP so that the top surface of the barrier film 14 is exposed. Finally, as shown in FIG. 1(d), in the third polishing process, the residue of the portion of the conductive film 15, which is positioned outside the trenches 13, and the portion of the barrier film 14, which is positioned outside the trenches 13, are removed by CMP so that the top surface of the insulating film 12 is exposed. Consequently, the portion of the conductive film 15 which is positioned inside the trenches 13 is left on the insulating film 12 and will act as wiring 17. The barrier film 14 serves to prevent copper in the conductive film 15 (the wiring 17) from diffusing in the insulating film 12.

The polishing composition according to the first embodiment is for example used in CMP in the second polishing process. This polishing composition comprises: an ingredient (a) comprising a surfactant; an ingredient (b) comprising a silicon oxide; an ingredient (c) comprising at least one selected from the group consisting of carboxylic acid and alpha-amino acid; an ingredient (d) comprising a corrosion inhibitor; an ingredient (e) comprising an oxidant; and an ingredient (f) comprising water.

The ingredient (a), namely the surfactant, contains at least one selected from the compounds, each represented by any of general formulas (1) to (7), and the salt thereof. The surfactant preferably contains at least one selected from the first group consisting of compounds, each represented by any of general formulas (1) to (7), and the salt thereof, and at least one selected from the second group consisting of compounds, each represented by any of general formulas (8) and (9), and the salt thereof.

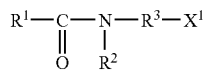  (1)

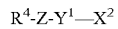  (2)

  (3)

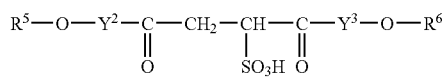  (4)

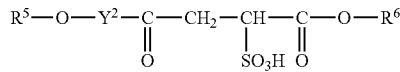  (5)

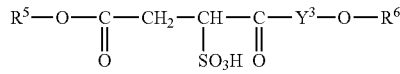  (6)

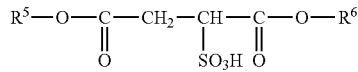  (7)

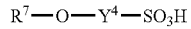  (8)

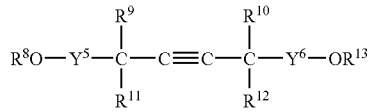  (9)

In general formula (1), $R^1$ represents an alkyl group having 8 to 16 carbon atoms. $R^2$ represents a hydrogen atom, a methyl group, or an ethyl group. $R^3$ represents an alkylene group having 1 to 8 carbon atoms, $-(CH_2CH_2O)_l-$, $-(CH_2CH(CH_3)O)_m-$, or a combination of at least two of those. Herein, l and m are integers of 1 to 8 when $R^3$ represents $-(CH_2CH_2O)_l-$ or $-(CH_2CH(CH_3)O)_m-$, and the sum of l and m is 8 or less when $R^3$ represents the combination of $-(CH_2CH_2O)_l-$ and $-(CH_2CH(CH_3)O)_m-$, namely $R^3$ represents a group formed by removing a hydrogen atom from a copolymer of ethylene oxide and propylene oxide. $X^1$ represents a carboxy group or a sulfone group.

In general formulas (2) and (3), $R^4$ represents an alkyl group having 8 to 16 carbon atoms. Z is a functional group represented by chemical formula (i) or (ii). $Y^1$ represents $-(CH_2CH_2O)_n-$, $-(CH_2CH(CH_3)O)_p-$, or the combination of $-(CH_2CH_2O)_n-$ and $-(CH_2CH(CH_3)O)_p-$. Herein, n and p are integers of 1 to 6 when $Y^1$ represents $-(CH_2CH_2O)_n-$ or $-(CH_2CH(CH_3)O)_p-$, and the sum of n and p is an integer of 6 or less when $Y^1$ represents the combination of $-(CH_2CH_2O)_n-$ and $-(CH_2CH(CH_3)O)_p-$, namely $Y^1$ represents a group formed by removing a hydrogen atom from a copolymer of ethylene oxide and propylene oxide. $X^2$ represents a phosphate group or a sulfone group.

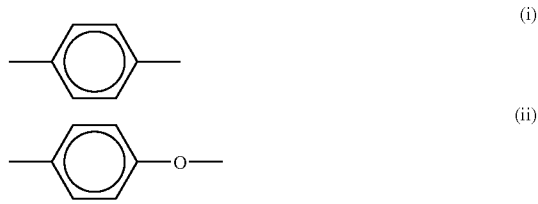

(i)

(ii)

In general formulas (4) to (7), each of $R^5$ and $R^6$ represents a hydrogen atom, a hydroxy group or an alkyl group having 8 to 16 carbon atoms. Each of $Y^2$ and $Y^3$ represents $-(CH_2CH_2O)_q-$, $-(CH_2CH(CH_3)O)_r-$, or the combination of $-(CH_2CH_2O)_q-$ and $-(CH_2CH(CH_3)O)_r-$. Herein, q and r are integers of 1 to 6 when $Y^2$ or $Y^3$ represents $-(CH_2CH_2O)_q-$ or $-(CH_2CH(CH_3)O)_r-$, and the sum of q and r is an integer of 6 or less when $Y^2$ or $Y^3$ represents the combination of $-(CH_2CH_2O)_q-$ and $-(CH_2CH(CH_3)O)_r-$.

In general formula (8), $R^7$ represents an alkyl group having 8 to 16 carbon atoms. $Y^4$ represents $-(CH_2CH_2O)_s-$, $-(CH_2CH(CH_3)O)_t-$, or the combination of $-(CH_2CH_2O)_s-$ and $-(CH_2CH(CH_3)O)_t-$. Herein, s and t are integers of 2 to 30 when $Y^4$ represents $-(CH_2CH_2O)_s-$ or $-(CH_2CH(CH_3)O)_t-$, and the sum of s and t is an integer of 30 or less when $Y^4$ represents the combination of $-(CH_2CH_2O)_s-$ and $-(CH_2CH(CH_3)O)_t-$.

In general formula (9), each of $R^8$ to $R^{13}$ represents a hydrogen atom or an alkyl group having 1 to 10 carbon atoms. Each of $Y^5$ and $Y^6$ represents $-(CH_2CH_2O)_u-$ or $-(CH_2CH(CH_3)O)_v-$. Herein, u and v are integers of 1 to 20.

The salt of the compound represented by any of general formulas (1) to (9) may be exemplified by alkali metal salts, such as an ammonium salt and a sodium salt, and a triethanolamine salt. The compound represented by any of general formulas (1) to (8) and the salt thereof are anion surfactants. The compound represented by general formula (9) and the salt thereof are nonion surfactants.

As specific examples of the compound represented by general formula (1) and the salt thereof, the following can be is cited: palm oil fatty acid sarcosine triethanolamine, represented by chemical formula (10); palm oil fatty acid methyltaurine sodium, represented by chemical formula (11); and polyoxyethylene palm oil fatty acid monoethanolamide sodium sulfate, represented by chemical formula (12).

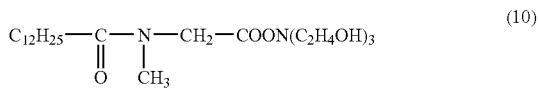

(10)

-continued

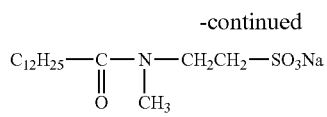

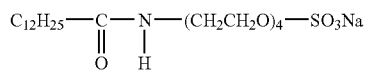

As specific examples of the compound represented by general formula (2) or (3) and the salt thereof, the following can be cited: polyoxyethylene alkyl phenyl ether phosphate, represented by chemical formula (13); and triethanolamine dodecylbenzenesulfonate, represented by chemical formula (14).

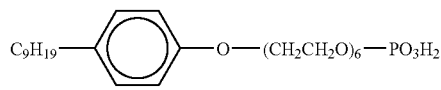

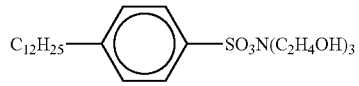

As specific examples of the compound represented by any of general formulas (4) to (7) and the salt thereof, the following can be cited: polyoxyethylene alkyl sulfosuccinate disodium, represented by chemical formula (15), and dioctyl sulfosuccinate, represented by chemical formula (16).

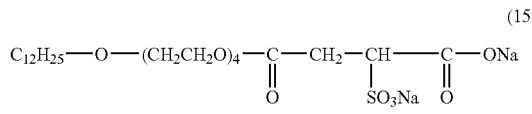

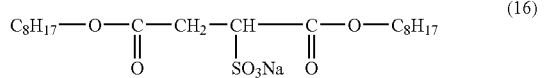

As specific example of the compound represented by general formula (8) and the salt thereof, polyoxyethylene lauryl ether sulfate triethanolamine, represented by chemical formula (17), can be cited.

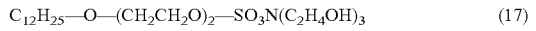

As specific example of the compound represented by general formula (9) and the salt thereof, diisobutyl dimethyl butynediol polyoxyethylene glycol ether, represented by chemical formula (18), can be cited.

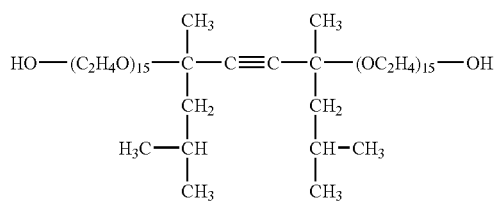

Figure 2A:
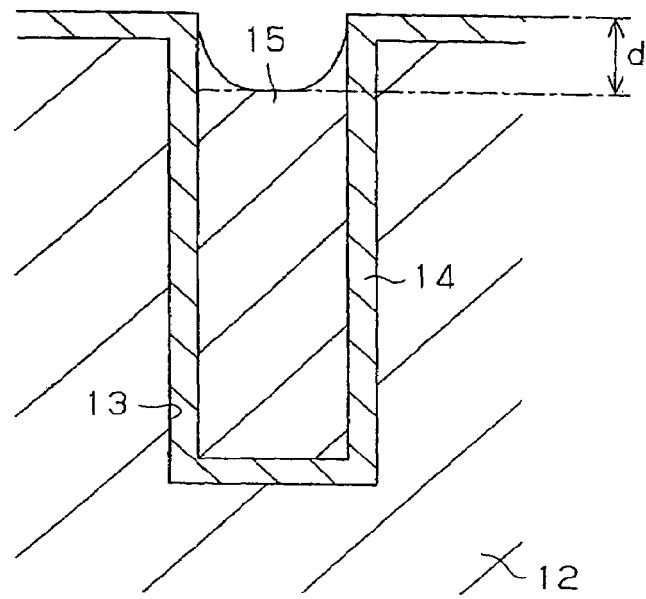
FIG. 2(a) is a cross sectional view for explaining "dishing"

A compound selected from the first group or the second group, namely a compound represented by any of general formulas (1) to (9), and the salt thereof, act to suppress the occurrence of the dishing by reducing the depth of the dishing. As shown in FIG. 2(a), the depth of the dishing is the difference "d" between the level of the top surface of the conductive film 15 left on the insulating film 12 and the level of the top surface of the part of the barrier film 14, which is positioned outside the trenches 13. As compared to the compound selected from the second group, the compound selected from the first group has a slightly stronger action to suppress the occurrence of the dishing, but has a markedly stronger action to suppress polishing of the copper containing metal. This makes it less possible to suppress polishing of the copper containing metal too strongly when the surfactant comprises at least one compound selected from the first group and at least one compound selected from the second group than when the surfactant comprises only at least one compound selected from the first group.

The content of the surfactant in the polishing composition is preferably in the range of 0.025 to 0.2 mass %, and more preferably in the range of 0.03 to 0.1 mass %. When the content of the surfactant is less than 0.025 mass %, the depth of the dishing is not largely reduced, and the occurrence of the dishing thus might not be suppressed. When the content of the surfactant is more than 0.2 mass %, polishing of the copper containing metal is suppressed too strongly, and hence the conductive film 15 to be removed might be left on the insulating film 12 after polishing.

When the surfactant comprises at least one compound selected from the first group and at least one compound selected from the second group, a mass ratio of the compound selected from the first group contained in the surfactant to the compound selected from the second group contained in the surfactant is preferably from one first to ten firsts (1/1 to 10/1). When the ratio is less than one first, the occurrence of the dishing might not be much suppressed. When the ratio is more than ten firsts, polishing of the copper containing metal is suppressed too strongly, and hence the conductive film 15 to be removed might be left on the insulating film 12 after polishing.

The ingredient (b), namely a silicon oxide, acts to mechanically polish an object to be polished. The silicon oxide may for example be colloidal silica, fumed silica, or precipitated silica. Among them, colloidal silica and fumed silica are preferable since each of them has a high ability to polish the copper containing metal, and colloidal silica is more preferable. The polishing composition may contain two kinds or more of silicon oxides.

Figure 2B:
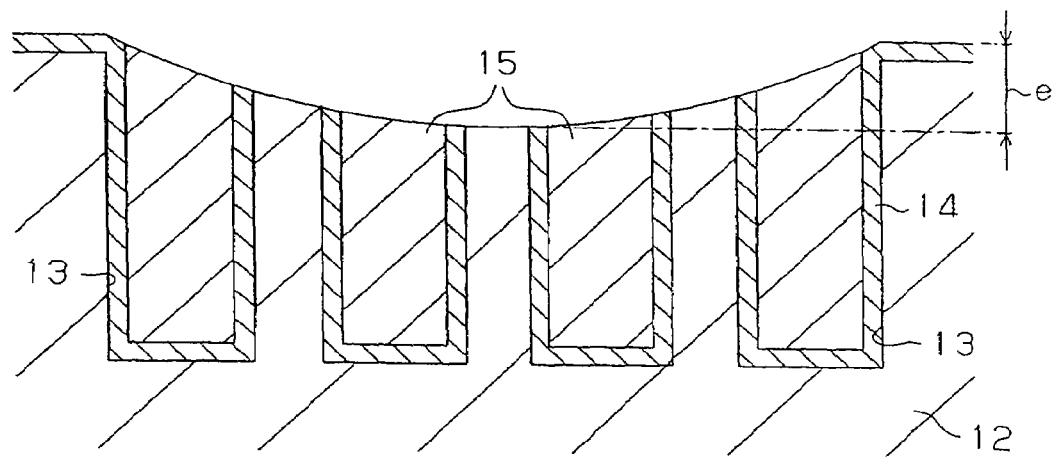
FIG. 2(b) is a cross sectional view for explaining "erosion".

The mean particle diameter $D_{N4}$ of the silicon oxide, which is measured by laser diffraction scattering, is preferably in the range of 0.01 to 0.5 μm, and more preferably in the range of 0.03 to 0.3 μm. When the mean-particle diameter $D_{N4}$ of the silicon oxide is less than 0.01 μm, the action of the silicon oxide to mechanically polish an object to be polished is so weak that the conductive film 15 to be removed might be left on the insulating film 12 after polishing. When the mean particle diameter $D_{N4}$ of the silicon oxide is more than 0.5 μm, the ability of the polishing composition to polish the copper containing metal is too high, which might cause an increase in depth of the dishing. Further, since the silicon oxide having the mean particle diameter $D_{N4}$ more than 0.5 μm tends to settle out, the dispersion stability of the polishing composition might decline. Moreover, since the polishing composition has a stronger ability to polish the barrier film 14 and the insulating film 12 as well as the conductive film 15, a phenomenon called erosion might occur, where the level of the top surface of the region in which the trenches 13 are densely formed, namely the level of the top surface of the wiring region, becomes lower than the level of the top surface of the region other than the wiring region. The degree of the erosion is expressed taking the depth of the erosion as an index. As shown in FIG. 2(b), the depth of the erosion is the difference "e" between the level of the top surface of the wiring region and the level of the top surface of the region other than the wiring region. As in the case of the dishing, the erosion causes more difficulty in increasing the wiring resistance and forming multi-filmed wiring.

The content of the silicon oxide in the polishing composition is preferably in the range of 0.01 to 10 mass %, and more preferably in the range of 0.1 to 3 mass %. When the content of the silicon oxide is less than 0.01 mass %, the ability of the polishing composition to polish an object to be polish is insufficient, and hence the conductive film 15 to be removed might be left on the insulating film 12 after polishing. When the content of the silicon oxide is more than 10 mass %, the ability of the polishing composition to polish an object to be polished is too high, which might lead to promotion of the dishing or erosion.

The ingredient (c), namely at least one selected from the group consisting of carboxylic acid and alpha-amino acid, acts to form a chelate bond with copper, leading to improvement in ability of the polishing composition to polish the copper containing metal. Because especially the ability of the polishing composition to polish the copper containing metal is improved, the number of carbon atoms in the molecule of the carboxylic acid or the alpha-amino acid is preferably not more than 10. The specific examples of the carboxylic acid may include citric acid, nitric acid, succinic acid, maleic acid, and tartaric acid. Carboxylic acid may be either monocarboxylic acid or dicarboxylic acid, and may comprise an amino group or a hydroxy group. Meanwhile, the specific examples of the alpha-amino acid may include glycin, alanine, and valine. Since acting to reduce the depth of the dishing, alpha-amino acid is more preferable than carboxylic acid, and alanine is more preferable.

The content of the acid in the polishing composition is preferably in the range of 0.01 to 2 mass %, and more preferably in the range of 0.4 to 1.5 mass %. When the content of the acid is less than 0.01 mass %, the ability of the polishing composition to polish the copper containing metal is insufficient, and thereby the conductive film 15 to be removed might be left on the insulating film 12 after polishing. When the content of the acid is more than 2 mass %, the concentration of the acid is too high, and thereby the ability of the polishing composition to polish the copper containing metal might decrease or the dishing might occur.

The ingredient (d), namely the corrosion inhibitor, acts to prevent corrosion of the surface of the conductive film 15 by protecting the copper containing metal from corrosion due to the oxidant. The corrosion inhibitor also acts to suppress the occurrence of the dishing by suppressing excessive polishing of the conductive film 15. The specific examples of the corrosion inhibitor may include the benzotriazoles represented by general formula (19), namely benzotriazole and the derivative thereof. In general formula (19), the respective carbon atoms at positions 4, 5, 6 and 7 may be replaced with nitrogen atoms, or the nitrogen atom at position 1 may be replaced with a carbon atom.

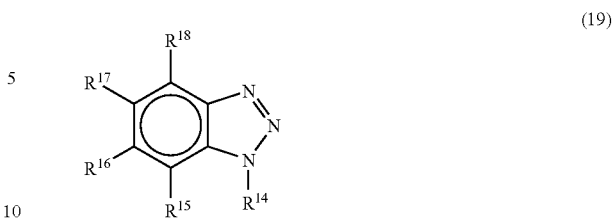

In general formula (19), $R^{14}$ represents a hydrogen atom, an alkyl group having a carboxy group, an alkyl group having a hydroxy group and a tert-amino group, an alkyl group having a hydroxy group, or an alkyl group other than those. $R^{15}$ to $R^{18}$ respectively represent a hydrogen atom or an alkyl group.

Strongly protecting the surface of the conductive film 15, the benzotriazole derivative, represented by general formula (20), is most preferable among the compounds represented by general formula (19).

In general formula (20), $R^{14}$ represents an alkyl group having a carboxy group, an alkyl group having a hydroxy group and a tert-amino group, an alkyl group having a hydroxy group, or an alkyl group other than those. The benzotriazole derivative, represented by general formula (20) where $R^{14}$ is an alkyl group having a carboxy group, includes the compound represented by general formula (21). The specific examples of compound represented by general formula (21) may include 1-(1,2-dicarboxyethyl)benzotriazole, represented by chemical formula (22).

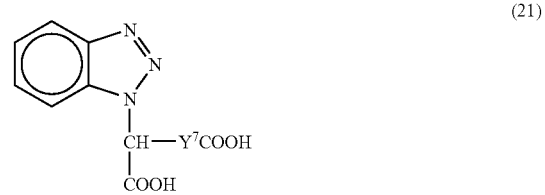

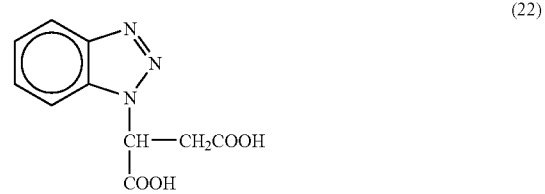

The benzotriazole derivative, represented by general formula (20) where $R^{14}$ is an alkyl group having a hydroxy group and a tert-amino group, includes the compound represented by general formula (23). The specific example of the compound represented by general formula (23) may include 1-[N,N-bis(hydroxyethyl)aminomethyl]benzotriazole, represented by chemical formula (24).

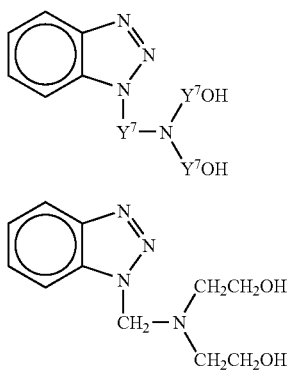

(23)

(24)

The benzotriazole derivative, represented by general formula (20) where $R^{14}$ is an alkyl group having a hydroxy group, includes the compound represented by general formula (25) and the compound represented by general formula (26). The specific examples of the compound represented by general formula (25) and the compound represented by general formula (26) may respectively include: 1-(2,3-dihydroxypropyl)benzotriazole, represented by chemical formula (27); and 1-(hydroxymethyl)benzotriazole, represented by chemical formula (28).

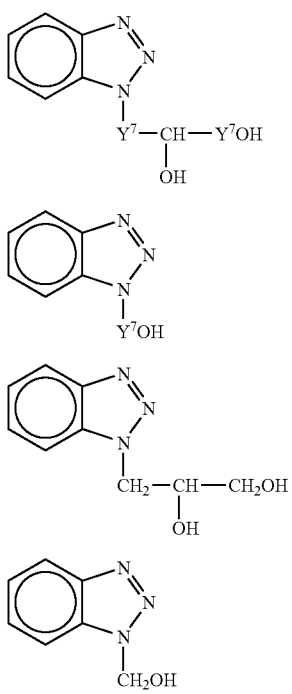

(25)

(26)

(27)

(28)

In general formulas (21), (23), (25) and (26), $Y^7$ represents an alkylene group.

The polishing composition may include two kinds or more of corrosion inhibitors. Among the corrosion inhibitors described above, 1-[N,N-bis(hydroxyethyl)aminomethyl]benzotriazole, represented by chemical formula (24), is most preferable since it acts particularly strongly to protect the surface of the conductive film 15.

The content of the corrosion inhibitor is preferably not more than 0.1 mass %. When the corrosion inhibitor is benzotriazole, the content of the corrosion inhibitor in the polishing composition is preferably in the range of 0.000001 to 0.001 mass %, and more preferably in the range of 0.00003 to 0.0005 mass %. When the corrosion inhibitor is 1-[N,N-bis(hydroxyethyl)aminomethyl]benzotriazole, the content of the corrosion inhibitor in the polishing composition is preferably in the range of 0.00005 to 0.005 mass %, and more preferably in the range of 0.0001 to 0.001 mass %. When the corrosion inhibitor is 1-(2,3-dihydroxypropyl)benzotriazole, the content of the corrosion inhibitor in the polishing composition is preferably in the range of 0.001 to 0.1 mass %, and more preferably in the range of 0.003 to 0.05 mass %. When the corrosion inhibitor is 1-(1,2-dicarboxyethyl)benzotriazole, the content of the corrosion inhibitor in the polishing composition is preferably in the range of 0.0005 to 0.01 mass %, and more preferably in the range of 0.002 to 0.008 mass %.

When the content of the corrosion inhibitor is too small, the action of protecting the surface of the conductive film 15 and the action of suppressing the occurrence of the dishing are insufficiently exerted, which might result in production of the roughness or promotion of the dishing on the surface of the conductive film 15 after polishing. When the content of the corrosion inhibitor is too large, the ability of the polishing composition to polish the copper containing metal is insufficient, and hence the conductive film 15 to be removed might be left on the insulating film 12 after polishing.

The ingredient (e), namely the oxidant, acts to promote mechanical polishing with the silicon oxide by oxidizing the copper containing metal. The oxidant may be a persulfate, such as ammonium persulfate, potassium persulfate, or sodium persulfate, periodic acid, peracetic acid, perchloric acid, ammonium percarbonate, or hydrogen peroxide. Among them, since having a high ability to oxidize copper, the persulfate is preferable, and ammonium persulfate is more preferable.

The content of the oxidant in the polishing composition is preferably in the range of 0.5 to 10 mass %, and more preferably in the range of 1 to 5 mass %. When the content of the oxidant is less than 0.5 mass %, the ability of the polishing composition to polish the copper containing metal is insufficient, and thereby the conductive film 15 to be removed might be left on the insulating film 12. When the content of the oxidant is more than 10 mass %, the ability of the polishing composition to polish the copper containing metal is too high, which might cause an increase in depth of the dishing.

The ingredient (f), namely water, serves as a solvent to dissolve or disperse the ingredients other than water in the polishing composition. Water preferably contains as few impurities as possible. Specifically, pure water, obtained by removing impurity ions with an ion-exchange resin and then contaminants through a filter, ultrapure water, or distilled water is preferable.

Water is added with the ingredients (a) to (e), followed by mixing, to prepare a polishing composition. In mixing, a blade-type agitator, an ultrasonic disperser or the like may be used. There is no limitation to the order of adding the ingredients (a) to (e) to water.

The pH of the polishing composition is preferably not less than 7, more preferably from 7 to 12, and most preferably from 8 to 10. When the pH of the polishing composition is less than 7, the ability of the polishing composition to polish the copper containing metal might decrease. When the pH of the polishing composition is more than 12, the ability of the polishing composition to polish the copper containing metal is too high, which might lead to promotion of the dishing. The pH of the polishing composition may be adjusted by addition of ammonia to the polishing composition.

When CMP in the second polishing process is conducted using the polishing composition according to the first embodiment, a polishing pad is pressed onto the surface of the conductive film 15 and then rolled while the polishing composition is provided to the surface of the conductive film 15.

The polishing composition according to the first embodiment can suppress the occurrence of the dishing by the actions of the surfactant and the corrosion inhibitor contained therein. Further, the ability of the polishing composition to polish the copper containing metal is improved by the actions of the oxidant and at least one selected from the group consisting of carboxylic acid and alpha-amino acid in the polishing composition.

Next, a second embodiment of the present invention will be described.

As in the case of the polishing composition according to the first embodiment, a polishing composition according to the second embodiment is also used in CMP in the second polishing process.

The polishing composition according to the second embodiment comprises; an ingredient (a) comprising alpha-amino acid; an ingredient (b) comprising a benzotriazole derivative; an ingredient (c) comprising a silicon oxide; an ingredient (d) comprising a surfactant; an ingredient (e) comprising an oxidant; and an ingredient (f) comprising water.

The ingredient (a), namely alpha-amino acid, acts to suppress the occurrence of the dishing by reducing the depth of the dishing. Alpha-amino acid also acts to form a chelate bond with copper, whereby the ability of the polishing composition to polish the copper containing metal is improved. The specific examples of the alpha-amino acid may include alanine, glycin, and valine. Among them, alanine is most preferable since it strongly acts to reduce the depth of the dishing and also has high solubility to water. The polishing composition may contain two kinds or more of alpha-amino acids.

The content of alpha-amino acid in the polishing composition is preferably in the range of 0.01 to 2 mass %, and more preferably from 0.4 to 1.5 mass %. When the content of the alpha-amino acid is less than 0.01 mass %, the depth of the dishing is not sufficiently reduced, and the occurrence of the dishing thus might not be suppressed. When the content of the alpha-amino acid is more than 2 mass %, the ability of the polishing composition to polish the copper containing metal decrease, and thereby the conductive film 15 to be removed might be left on the insulating film 12 after polishing.

The ingredient (b), namely the benzotriazole derivative, is represented by general formula (29). The benzotriazole derivative acts to prevent corrosion of the surface of the conductive film 15 by protecting the copper containing metal from corrosion due to the oxidant. The benzotriazole derivative also acts to suppress the occurrence of the dishing by suppressing excessive polishing of the conductive film 15.

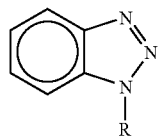

(29)

In general formula (29), R represents an alkyl group having a carboxy group, an alkyl group having a hydroxy group and a tert-amino group, an alkyl group having a hydroxy group, or an alkyl group other than those.

The benzotriazole derivative, represented by general formula (29) where R is an alkyl group having a carboxy group, includes the compound represented by general formula (21). The specific example of the compound represented by general formula (21) may include 1-(1,2-dicarboxyethyl)benzotriazole, represented by chemical formula (22).

The benzotriazole derivative, represented by general formula (29) where R is an alkyl group having a hydroxy group and a tert-amino group, includes the compound represented by general formula (23). The specific example of the compound represented by general formula (23) may include 1-[N,N-bis(hydroxyethyl)aminomethyl]benzotriazole, represented by chemical formula (24).

The benzotriazole derivative, represented by general formula (29) where R is an alkyl group having a hydroxy group, includes the compound represented by general formula (25) and the compound represented by general formula (26) The specific examples of the compound represented by general formula (25) and the compound represented by general formula (26) may respectively include: 1-(2,3-dihydroxypropyl)benzotriazole, represented by chemical formula (27); and 1-(hydroxymethyl)benzotriazole, represented by chemical formula (28).

The polishing composition may comprise two kinds or more of benzotriazole derivatives. Among the benzotriazole derivatives described above, the compounds respectively represented by general formulas (21), (23), (25), and (26) are preferable since they strongly act to protect the surface of the conductive film 15.

The content of the benzotriazole derivative is preferably not more than 0.1 mass %. When the benzotriazole derivative is the compound represented by general formula (21), the content of the benzotriazole derivative in the polishing composition is preferably in the range of 0.0005 to 0.01 mass %, and more preferably in the range 0.002 to 0.008 mass %. When the benzotriazole derivative is the compound represented by general formula (23), the content of the benzotriazole derivative in the polishing composition is preferably in the range of 0.00005 to 0.005 mass %, and more preferably in the range of 0.0001 to 0.001 mass %. When the benzotriazole derivative is the compound represented by general formula (25) or general formula (26), the content of the benzotriazole derivative in the polishing composition is preferably in the range of 0.001 to 0.1 mass %, and more preferably in the range of 0.003 to 0.05 mass %.

When the content of the benzotriazole derivative is too small, the action of protecting the surface of the conductive film 15 and the action of suppressing the occurrence of the dishing are insufficiently exerted, which might result in production of the roughness or promotion of the dishing on the surface of the conductive film 15 after polishing. When the content of the benzotriazole derivative is too large, the ability of the polishing composition to polish the copper containing metal is insufficient, and thereby the conductive film 15 to be removed might be left on the insulating film 12 after polishing.

The ingredient (c), namely a silicon oxide, acts to mechanically polish an object to be polished. The silicon oxide may for example be colloidal silica, fumed silica, or precipitated silica. Among them, colloidal silica and fumed silica are more preferable since each of them has a high ability to polish the copper containing metal, and colloidal silica is most preferable. The polishing composition may contain two kinds or more of silicon oxides.

The mean particle diameter $D_{N4}$ of the silicon oxide, which is measured by laser diffraction scattering, is preferably in the range of 0.01 to 0.5 μm, and more preferably in the range of 0.03 to 0.3 μm. When the mean particle diameter $D_{N4}$ of the silicon oxide is less than 0.01 μm, the action of the silicon oxide to mechanically polish an object to be polished is so weak that the conductive film 15 to be removed might be left on the insulating film 12 after polishing. When the mean particle diameter $D_{N4}$ of the silicon oxide is more than 0.5 μm, the ability of the polishing composition to polish the copper containing metal is too high, which might cause an increase in depth of the dishing. Further, since the silicon oxide having the mean particle diameter $D_{N4}$ more than 0.5 μm tends to settle out, the dispersion stability of the polishing composition might decline. Moreover, the polishing composition has a stronger ability to polish the barrier film 14 and the insulating film 12 as well as the conductive film 15, which might promote the erosion.

The content of the silicon oxide in the polishing composition is preferably in the range of 0.01 to 10 mass %, and more preferably in the range of 0.1 to 3 mass %. When the content of the silicon oxide is less than 0.01 mass %, the ability of the polishing composition to polish an object to be polish is insufficient, and thereby the conductive film 15 to be removed might be left on the insulating film 12 after polishing. When the content of the silicon oxide is more than 10 mass %, the ability of the polishing composition to polish an object to be polished is too high, which might lead to promotion of the dishing or erosion.

The ingredient (d), namely the surfactant, acts to suppress the occurrence of the dishing by reducing the depth of the dishing. The specific examples of the surfactant may include: palm oil fatty acid sarcosine triethanolamine, represented by chemical formula (10); palm oil fatty acid methyltaurine sodium, represented by chemical formula (11); polyoxyethylene palm oil fatty acid monoethanolamide sodium sulfate, represented by chemical formula (12); polyoxyethylene alkyl phenyl ether phosphate, represented by chemical formula (13); triethanolamine dodecylbenzenesulfonate, represented by chemical formula (14); polyoxyethylene alkyl sulfosuccinate disodium, represented by chemical formula (15); dioctyl sulfosuccinate, represented by chemical formula (16); polyoxyethylene lauryl ethereal sulfate triethanolamine, represented by chemical formula (17); and diisobutyl dimethyl butynediol polyoxyethylene glycol ether, represented by chemical formula (18).

The content of the surfactant in the polishing composition is preferably in the range of 0.025 to 0.2 mass %, and more preferably in the range of 0.03 to 0.1 mass %. When the content of the surfactant is less than 0.025 mass %, the depth of the dishing is not largely reduced, and the occurrence of the dishing thus might not be suppressed. When the content of the surfactant is more than 0.2 mass %, polishing of the copper containing metal is suppressed too strongly, and thereby the conductive film 15 to be removed might be left on the insulating film 12 after polishing.

The ingredient (e), namely the oxidant, acts to promote mechanical polishing with the silicon oxide by oxidizing the copper containing metal. The oxidant may be a persulfate, such as ammonium persulfate, potassium persulfate, or sodium persulfate, periodic acid, peracetic acid, perchloric acid, ammonium percarbonate or hydrogen peroxide. Among them, since having a high ability to oxidize copper, the persulfate is preferable, and ammonium persulfate is more preferable.

The content of the oxidant in the polishing composition is preferably in the range of 0.5 to 10 mass %, and more preferably in the range of 1 to 5 mass %. When the content of the oxidant is less than 0.5 mass %, the ability of the polishing composition to polish the copper containing metal is insufficient, and thereby the conductive film 15 to be removed might be left on the insulating film 12. When the content of the oxidant is more than 10 mass %, the ability of the polishing composition to polish the copper containing metal is too high, which might cause an increase in depth of the dishing.

The ingredient (f), namely water, serves as a solvent to dissolve or disperse the ingredients-other than water in the polishing composition. Water preferably contains as few impurities as possible. Specifically, pure water, obtained by removing impurity ions with an ion-exchange resin and then contaminants through a filter, ultrapure water, or distilled water is preferable.

Water is added with the ingredients (a) to (e), followed by mixing, to prepare a polishing composition. In mixing, a blade-type agitator, an ultrasonic disperser or the like may be used. There is no limitation to the order of adding the ingredients (a) to (e) to water.

The pH of the polishing composition is preferably not less than 7, more preferably from 7 to 12, and most preferably from 8 to 10. When the pH of the polishing composition is less than 7, the ability of the polishing composition to polish the copper containing metal might decrease. When the pH of the polishing composition is more than 12, the ability of the polishing composition to polish the copper containing metal is too high, which might lead to promotion of the dishing. The pH of the polishing composition may be adjusted by addition of ammonia to the polishing composition.

When performing chemical mechanical polishing of the second polishing process using the polishing composition according to the second embodiment, the polishing pad is pressed against the surface of the conductive film 15 while polishing composition is supplied to the surface of the conductive film 15, and rotated.

In the polishing composition according to the second embodiment, the occurrence of dishing is suppressed due to the action of the alpha-amino acid, benzotriazol derivative, and surfactant of the polishing composition. In addition, the capability of the polishing composition to polish the copper containing metal improves due to the action of the alpha-amino acid and oxidant in the polishing composition.

A third embodiment according to the present invention will now be described.

The polishing composition according to the third embodiment is also used in the chemical mechanical polishing of the second polishing process, same as the polishing compositions according to the first and second embodiments.

The polishing composition according to the third embodiment comprises; an ingredient (a) comprising a silicon oxide; an ingredient (b) comprising at least one selected from the group consisting of carboxylic acid and alpha-amino acid; an ingredient (q) comprising a corrosion inhibitor; an ingredient (d) comprising a surfactant; an ingredient (e) comprising a persulfate; and an ingredient (f) comprising water. The polishing composition further comprises ammonium ion.

Ingredient (a), namely silicon oxide, acts to mechanically polish the surface to be polished. Specific examples of silicon oxide include colloidal silica, fumed silica, and precipitated silica. Among these, colloidal silica or fumed silica is preferred because of their high capability to polish the copper containing metal. The polishing composition may contain two or more types of silicon oxide.

The mean particle diameter $D_{N4}$ of the silicon oxide, which is measured by laser diffraction scattering, is preferably 0.01 to 0.5 μm, and more preferably 0.03 to 0.3 μm. When the mean particle diameter $D_{N4}$ of the silicon oxide is less than 0.01 µm, the silicon oxide action to mechanically polish an object to be polished is so weak, whereby there is a risk that the conductive film 15 which is meant to be removed remains on the insulating film 12 after polishing. When the mean particle diameter $D_{N4}$ of the silicon oxide is more than 0.5 µm, the capability of the polishing composition to polish the copper containing metal is too high, whereby there is a risk of the dishing depth increasing. Further, silicon oxide having a mean particle diameter $D_{N4}$ of more than 0.5 µm precipitates more easily, whereby there is the risk that the dispersion stability of the polishing composition deteriorates. Still further, because the capability increases for the polishing composition to polish not only the conductive film 15, but also the barrier film 14 and insulating film 12, there is the risk of erosion being accelerated.

The content of silicon oxide in the polishing composition is preferably 0.01 to 10 mass %, and more preferably 0.1 to 3 mass %. When the content of the silicon oxide is less than 0.01 mass %, the capability of the polishing composition to polish is insufficient, whereby there is a risk that the conductive film 15 which is meant to be removed remains on the insulating film 12 after polishing. When the content of silicon oxide exceeds 10 mass %, there is a risk that the occurrence of dishing and erosion is accelerated due to the capability of the polishing composition for polishing the object to be polished being too high.

Ingredient (b), namely the at least one selected from the group consisting of carboxylic acid and alpha-amino acid, acts to cause a chelate bond with copper, whereby the capability of the polishing composition to polish the copper containing metal increases. To particularly increase the capability of the polishing composition to polish the copper containing metal, the number of carbon atoms that the carboxylic acid and alpha-amino acid contain in one molecule is preferably not more than 10. Specific examples of the carboxylic acid include, for example, citric acid, oxalic acid, succinic acid, maleic acid, and tartaric acid. The carboxylic acid may be either a monocarboxylic or a dicarboxylic acid, and may contain an amino group or a hydroxy group. Specific examples of the alpha-amino acid include, for example, glycine, alanine, and valine. To have an effect of reducing dishing depth, an alpha-amino acid is preferable from among carboxylic acid and alpha-amino acid, and alanine is more preferable.

The acid content in the polishing composition is preferably 0.01 to 2 mass %, and more preferably 0.4 to 1.5 mass %. When the acid content is less than 0.01 mass %, the capability of the polishing composition to polish the copper containing metal is insufficient, whereby there is a risk that the conductive film 15 which is meant to be removed remains on the insulating film 12 after polishing. When the acid content exceeds 2 mass %, acid concentration is too high, whereby there is a risk that the capability of the polishing composition to polish the copper containing metal decreases, and also a risk that the occurrence of dishing is accelerated.

Ingredient (c), namely a corrosion inhibitor, acts to inhibit surface corrosion of the conductive film 15 by protecting the copper containing metal from corrosion caused by persulfate. The corrosion inhibitor also acts to suppress the occurrence of dishing by suppressing the conductive film 15 from being excessively polished. Specific examples of the corrosion inhibitor include, for example, a benzotriazole represented by general formula (19). In general formula (19), the carbon atom on the fourth, fifth, sixth, or seventh position can be substituted by a nitrogen atom, and the nitrogen atom on the first position may be substituted by a carbon atom. The benzotriazole derivative represented by general formula (20) is preferable of the compounds represented by general formula (19), because its action to protect the surface of the conductive film 15 is strong.

The benzotriazole derivatives represented by general formula (20), in which $R^{14}$ is an alkyl group having a carboxyl group, include the compounds represented by general formula (21). Examples of compounds represented by general formula (21) include, for example, the 1-(1,2-dicarboxyethyl)benzotriazole represented by chemical formula (22).

The benzotriazole derivatives represented by general formula (20), in which $R^{14}$ is an alkyl group having a hydroxy group and a tertiary amino group, include the compounds represented by general formula (23) Examples of compounds represented by general formula (23) include, for example, the 1-[N,N-bis(hydroxyethyl)aminomethyl]benzotriazole represented by chemical formula (24).

The benzotriazole derivatives represented by general formula (20), in which $R^{14}$ is an alkyl group having a hydroxy group, include the compounds represented by general formula (25) and the compounds represented by general formula (26). Examples of compounds represented by general formulas (25) and (26) include, for example, the 1-(2,3-dihydroxypropyl)benzotriazole represented by chemical formula (27) and 1-(hydroxymethyl)benzotriazole represented by chemical formula (28).

The polishing composition may comprise two types or more of a corrosion inhibitor. Among the above-described corrosion inhibitors, 1-[N,N-bis(hydroxyethyl)aminomethyl]benzotriazole represented by chemical formula (24) is preferable, because its action to protect the surface of the conductive film 15 from corrosion caused by acid is strong.

The content of the corrosion inhibitor in the polishing composition is preferably 0.1 mass % or less. When the corrosion inhibitor is benzotriazole, the content of the corrosion inhibitor in the polishing composition is preferably 0.000001 to 0.001 mass %, and more preferably 0.0.0003 to 0.0005 mass %. When the corrosion inhibitor is 1-[N,N-bis(hydroxyethyl)aminomethyl]benzotriazole, the content of the corrosion inhibitor in the polishing composition is preferably 0.00005 to 0.005 mass %, and more preferably 0.0001 to 0.001 mass %. When the corrosion inhibitor is 1-(2,3-dihydroxypropyl)benzotriazole, the content of the corrosion inhibitor in the polishing composition is preferably 0.001 to 0.1 mass %, and more preferably 0.003 to 0.05 mass %. When the corrosion inhibitor is 1-(1,2-dicarboxyethyl) benzotriazole, the content of the corrosion inhibitor in the polishing composition is preferably 0.0005 to 0.01 mass %, and more preferably 0.002 to 0.008 mass %.

When the content of the corrosion inhibitor is too small, there is a risk that roughness will appear or dishing will occur on the surface of the polished conductive film 15, due to the action for protecting the surface of the conductive film 15 and the action for suppressing the occurrence of dishing not being sufficient. When the content of the corrosion inhibitor is too much, there is a risk of the conductive film 15 which is meant to be removed remaining on the insulating film 12 after polishing, due to the capability of the polishing composition to polish the copper containing metal later not being sufficient.

Ingredient (d), namely a surfactant, acts to suppress the occurrence of dishing by reducing the dishing depth. Specific examples of the surfactant include, for example, palm oil fatty acid sarcosine triethanolamine represented by chemical formula (10), palm oil fatty acid methyltaurine sodium represented by chemical formula (11), polyoxyethylene palm oil fatty acid monoethanolamide sodium sulfate represented by chemical formula (12), polyoxyethylene alkylphenyl ether phosphate represented by chemical formula (13), dodecylbenzenesulfonate triethanolamine represented by chemical formula (14), polyoxyethylene alkyl sodium sulfosuccinate represented by chemical formula (15), dioctyl type succinates represented by chemical formula (16), polyoxyethylene lauryl ether sulfate triethanolamine represented by chemical formula (17) and diisobutyldimethylbutyne diol polyoxyethylene glycol ether represented by chemical formula (18).

The surfactant content in the polishing composition is preferably 0.025 to 0.2 mass %, and more preferably 0.03 to 0.1 mass %. When the surfactant content is less than 0.025 mass %, the dishing depth is hardly reduced, whereby there is a risk that the occurrence of dishing cannot be suppressed. When the surfactant content exceeds 0.2 mass %, polishing of the copper containing metal is too strongly suppressed, whereby there is a risk that the conductive film 15 which is meant to be removed remains on the insulating film 12 after polishing.

Ingredient (e), namely a persulfate, acts to accelerate mechanical polishing using silicon oxide through oxidation of the copper containing metal. The persulfate may be ammonium persulfate, potassium persulfate, or sodium persulfate. Among these, ammonium persulfate is preferable, in view of its strong capability of oxidizing copper as well as it serving as a supply source for ammonium ion.

The persulfate content in the polishing composition is preferably 0.5 to 10 mass %, and more preferably 1 to 5 mass %. When the persulfate content is less than 0.5 mass %, there is a risk that the conductive film 15 which is meant to be removed remains on the insulating film 12 after polishing due to the capability of the polishing composition to polish the copper containing metal being insufficient. When the persulfate content exceeds 10 mass %, there is a risk of the dishing depth increasing due to the capability of the polishing composition to polish the copper containing metal being too high.

Ingredient (f), namely water, acts as a medium for dissolving or dispersing the ingredients other than water that are in the polishing composition. The water preferably contains as little impurities as possible. Specific examples include pure water from which impurity ions were removed using an ion-exchange resin, and was then passed through a filter to remove foreign substances, ultra-pure water, or distilled water.

The polishing composition is prepared by adding Ingredients (a) to (e) to water, and mixing. During the mixing, a blade-type agitator or an ultrasonic dispersing apparatus can be used. The order of adding Ingredients (a) to (e) to water is not specifically limited.

The pH of the polishing composition is from 7 or more to less than 12, preferably from 8.5 to 11, and more preferably from 9 to 11. When the polishing composition pH is less than 7, there is a risk that the capability of the polishing composition to polish the copper containing metal is insufficient. When the polishing composition pH exceeds 12, there is a risk of the occurrence of dishing being accelerated due to the capability of the polishing composition to polish the copper containing metal being too high. The polishing composition pH may be adjusted by the addition of a pH modifier to the polishing composition. To improve pH stability of the polishing composition, the pH modifier is preferably ammonia; an ammonium salt such as ammonium carbonate, ammonium sulfate, ammonium bicarbonate, ammonium phosphate, ammonium hydrogenphosphate, ammonium lactate, ammonium citrate, and ammonium glycolate; or the hydroxide or salt of an alkali metal. Among these, ammonium salts are more preferable. The polishing composition may comprise two or more pH modifiers. The pH modifier content in the polishing composition is preferably 0.0001 to 10 mass %.

The ammonium ion in the polishing composition acts to increase the capability of the polishing composition to polish the copper containing metal. The ammonium ion preferably is derived from the persulfate or the pH modifier added to the polishing composition. The ammonium ion content is preferably 0.03 to 0.3 mass %, and more preferably 0.07 to 0.2 mass %.

When performing chemical mechanical polishing of the second polishing process using the polishing composition according to the third embodiment, the polishing pad is pressed against the surface of the conductive film 15 while supplying polishing composition to the surface of conductive film 15, and rotated.

In the polishing composition according to the third embodiment, the occurrence of dishing is suppressed due to the action of the at least one selected from the group consisting of carboxylic acid and alpha-amino acid, the corrosion inhibitor, and the surfactant in the polishing composition. In addition, the capability of the polishing composition to polish the copper containing metal improves due to the action of the ammonium ion in the polishing composition.

A fourth embodiment according to the present invention will now be described.

The polishing composition according to the fourth embodiment is also used in the chemical mechanical polishing of the second polishing process, same as the polishing compositions according to the first, second and third embodiments.

The polishing composition according to the fourth embodiment comprises an ingredient (a) which consists of a first silicon oxide; an ingredient (b) which consists of a second silicon oxide; an ingredient (c) which consists of at least one selected from the group consisting of carboxylic acid and alpha-amino acid; an ingredient (d) which consists of a corrosion inhibitor; an ingredient (e) which consists of a surfactant; an ingredient (f) which consists of an oxidant; and an ingredient (g) which consists of water.

Ingredient (a), namely the first silicon oxide, acts to mechanically polishing the surface to be polished, and more specifically, acts to relatively roughly polish the object to be polished. Accordingly, the conductive film 15, which is meant to be removed, can be suppressed from remaining on the insulating film 12 after polishing as a result of the improvement in the capability of the polishing composition to polish the copper containing metal. The first silicon oxide may be colloidal silica, fumed silica or precipitated silica. Among these, colloidal silica or fumed silica is preferred because of their high capability to polish the copper containing metal. The polishing composition may contain two or more types of the first silicon oxide.

The 50% particle diameter D50 of the first silicon oxide is from 60 to 150 nm. When the 50% of the sum of the weights of all the particles in the first silicon oxide consists of the accumulated weight of particles having a particle diameter not more than a specific size as measured by laser diffraction scattering, the specific size is the 50% particle diameter D50 of the first silicon oxide. That is, for example, when the 50% particle diameter D50 of the first silicon oxide is 60 nm, the 50% of the sum of the weights of all the particles in the first silicon oxide consists of the accumulated weight of particles having a particle diameter not more than 60 nm. When the 50% particle diameter D50 of the first silicon oxide is less than 60 nm, the first silicon oxide action for mechanically polishing the object to be polished is weak, whereby there is a risk that the conductive film 15 which is meant to be removed remains on the insulating film 12 after polishing. When the 50% particle diameter D50 of the first silicon oxide exceeds 150 nm, the capability of the polishing composition to polish the copper containing metal is too high, whereby there is a risk of the dishing depth and erosion depth increasing. Further, because a first silicon oxide having a 50% particle diameter D50 exceeding 150 nm precipitates more easily, there is a risk of the dispersion stability of the polishing composition deteriorating.

The particle distribution width of the first silicon oxide is preferably as narrow as possible. Specifically, the difference between the 75% particle diameter D75 of the first silicon oxide and the 25% particle diameter D25 of the first silicon oxide is preferably from 10 to 50 nm. When the 75% of the sum of the weights of all the particles in the first silicon oxide consists of the accumulated weight of particles having a particle diameter not more than a specific size as measured by laser diffraction scattering, the specific size is the 75% particle diameter D75 of the first silicon oxide. When the 25% of the sum of the weights of all the particles in the first silicon oxide consists of the accumulated weight of particles having a particle diameter not more than a specific size as measured by laser diffraction scattering, the specific size is the 25% particle diameter D25 of the first silicon oxide. It is not easy to prepare a first silicon oxide in which the difference between the 75% particle diameter D75 and the 25% particle diameter D25 is less than 10 nm. When the difference between the 75% particle diameter D75 and the 25% particle diameter D25 exceeds 50 nm, there is the risk that the capability of the polishing composition to polish the copper containing metal will deteriorate and that the dishing depth and erosion depth will increase. In addition, there is also the fear that scratches will develop on the object to be polished after polishing.

Ingredient (b), namely the second silicon oxide, acts to mechanically polish the surface to be polished, and more specifically, acts to relatively smoothly polish the object to be polished. Accordingly, the second silicon oxide reduces dishing depth and erosion depth, and thus suppresses the occurrence of dishing and erosion, by suppressing the copper containing metal from being excessively polished. The second silicon oxide may be colloidal silica, fumed silica, or precipitated silica. Among these, colloidal silica or fumed silica is preferred because of their high capability to polish the copper containing metal, and more preferred is colloidal silica. The polishing composition may contain two or more types of the second silicon oxide.

The 50% particle diameter D50 of the second silicon oxide is from 10 to 50 nm. When the 50% particle diameter D50 of the second silicon oxide is less than 10 nm, the second silicon oxide action for mechanically polishing the object to be polished is weak, whereby there is a risk that the conductive film 15 which is meant to be removed remains on the insulating film 12 after polishing. When the 50% particle diameter D50 of the second silicon oxide exceeds 50 nm, the action of the second silicon oxide for mechanically polishing the object to be polished is too high, whereby there is a risk of the occurrence of dishing and erosion being accelerated.

The particle distribution width of the second silicon oxide is, in the same manner as that of the first silicon oxide, preferably as narrow as possible. Specifically, the difference between the 75% particle diameter D75 of the second silicon oxide and the 25% particle diameter D25 of the second silicon oxide is preferably from 10 to 50 nm. It is not easy to prepare a second silicon-oxide in which the difference between the 75% particle diameter D75 and the 25% particle diameter D25 is less than 10 nm. When the difference between the 75% particle diameter D75 and the 25% particle diameter D25 exceeds 50 nm, there is the risk that the capability of the polishing composition to polish the copper containing metal will deteriorate and that the dishing depth and erosion depth will increase.

To effectively suppress the occurrence of dishing and erosion, and to also improve the ability of the polishing composition to polish the copper containing metal, when the value of the 50% particle diameter D50 of the first silicon oxide is relatively large, for example when it is 100 nm or more to 150 nm or less, the value of the 50% particle diameter D50 of the second silicon oxide is preferably relatively small, for example 10 nm or more to 30 nm or less. In the same manner, when the value of the 50% particle diameter D50 of the first silicon oxide is relatively small, for example when it is 60 nm or more to 100 nm or less, the value of the 50% particle diameter D50 of the second silicon oxide is preferably relatively large, for example 30 nm or more to 50 nm or less. However, a relatively small value of the 50% particle diameter D50 of the first silicon oxide and a relatively large value of the 50% particle diameter D50 of the second silicon oxide is preferable.

The total of the first silicon oxide content and the second silicon oxide content in the polishing composition is preferably 0.01 to 10 mass %, and more preferably 0.1 to 3 mass %. When the total silicon oxide content is less than 0.01 mass %, the capability of the polishing composition to polish is insufficient, whereby there is a risk that the conductive film 15 which is meant to be removed remains on the insulating film 12 after polishing. When the total silicon oxide content exceeds 10 mass %, there is the risk that the occurrence of dishing and erosion is accelerated due to the capability of the polishing composition for polishing the object to be polished being too high.

The ratio of the difference between the content of the first silicon oxide in the polishing composition and the content of the second silicon oxide in the polishing composition is determined as appropriate. For example, if more effective suppression of the occurrence of dishing and erosion is desired, the ratio of the second silicon oxide can be set to be high, while if more effective improvement in the polishing capability of the polishing composition is desired, the ratio of the first silicon oxide can be set to be high.

Ingredient (c), namely the at least one selected from the group consisting of carboxylic acid and alpha-amino acid, acts to cause a chelate bond with copper, whereby the capability of the polishing composition to polish the copper containing metal increases. To particularly increase the capability of the polishing composition to polish the copper containing metal, the number of carbon atoms that the carboxylic acid and alpha-amino acid contain in one molecule is preferably not more than 10. Specific examples of the carboxylic acid include, for example, citric acid, oxalic acid, succinic acid, maleic acid, and tartaric acid. The carboxylic acid may be either a monocarboxylic or a dicarboxylic acid, and may contain an amino group or a hydroxy group. Specific examples of the alpha-amino acid include, for example, glycine, alanine, and valine. To obtain an effect of reducing dishing depth, an alpha-amino acid is preferable from among carboxylic acid and alpha-amino acid, and alanine is more preferable.

The acid content in the polishing composition is preferably 0.01 to 2 mass %, and more preferably 0.4 to 1.5 mass %. When the acid content is less than 0.01 mass %, the capability of the polishing composition to polish the copper containing metal is insufficient, whereby there is a risk that the conductive film 15 which is meant to be removed remains on the insulating film 12 after polishing. When the acid content exceeds 2 mass %, the acid concentration is too high, whereby there is a risk that the capability of the polishing composition to polish the copper containing metal decreases and also a risk that the occurrence of dishing is accelerated.

Ingredient (d), namely a corrosion inhibitor, acts to inhibit surface corrosion of the conductive film 15 by protecting the copper containing metal from corrosion caused by an oxidant. The corrosion inhibitor also acts to suppress the occurrence of dishing by suppressing the conductive film 15 from being excessively polished. Specific examples of the corrosion inhibitor include, for example, a benzotriazole represented by general formula (19). In general formula (19), the carbon atom on the fourth, fifth, sixth, or seventh position can be substituted by a nitrogen atom, and the nitrogen atom on the first position may be substituted by a carbon atom. The benzotriazole derivative represented by general formula (20) is preferable of the compounds represented by general formula (19), because its action to protect the surface of the conductive film 15 is strong.

The benzotriazole derivatives represented by general formula (20), in which $R^{14}$ is an alkyl group having a carboxyl group, include the compounds represented by general formula (21). Examples of compounds represented by general formula (21) include, for example, the 1-(1,2-dicarboxyethyl) benzotriazole represented by chemical formula (22).

The benzotriazole derivatives represented by general formula (20), in which $R^{14}$ is an alkyl group having a hydroxy group and a tertiary amino group, include the compounds represented by general formula (23). Examples of compounds represented by general formula (23) include, for example, the 1-[N,N-bis(hydroxyethyl)aminomethyl] benzotriazole represented by chemical formula (24).

The benzotriazole derivatives represented by general formula (20), in which $R^{14}$ is an alkyl group having a hydroxy group, include the compounds represented by general formula (25) and the compounds represented by general formula (26). Examples of compounds represented by general formulas (25) and
 (26) include, for example, the 1-(2,3-dihydroxypropyl) benzotriazole represented by chemical formula (27) and the 1-(hydroxymethyl)benzotriazole represented by chemical formula (28).

The polishing composition may comprise two types or more of the above-described corrosion inhibitor. In the above-described corrosion inhibitor, 1-[N,N-bis(hydroxyethyl)aminomethyl] benzotriazole represented by chemical formula (24) is preferable, because its action to protect the surface of the conductive film 15 from corrosion caused by acid is strong.

The content of the corrosion inhibitor in the polishing composition is preferably 0.1 mass % or less. When the corrosion inhibitor is a benzotriazole, the content of the corrosion inhibitor in the polishing composition is preferably 0.000001 to 0.001 mass %, and more preferably 0.00003 to 0.0005 mass %. When the corrosion inhibitor is 1-[N,N-bis(hydroxyethyl)aminomethyl] benzotriazole, the content of the corrosion inhibitor in the polishing composition is preferably 0.00005 to 0.005 mass %, and more preferably 0.0001 to 0.001 mass %. When the corrosion inhibitor is 1-(2,3-dihydroxypropyl)benzotriazole, the content of the corrosion inhibitor in the polishing composition is preferably 0.001 to 0.1 mass %, and more preferably 0.003 to 0.05 mass %. When the corrosion inhibitor is 1-(1,2-dicarboxyethyl) benzotriazole, the content of the corrosion inhibitor in the polishing composition is preferably 0.0005 to 0.01 mass %, and more preferably 0.002 to 0.008 mass %.

When the content of the corrosion inhibitor is too small, there is a risk that roughness will appear or dishing will occur on the surface of the polished conductive film 15, due to the action for protecting the surface of the conductive film 15 and the action for suppressing the occurrence of dishing not being sufficient. When the content of the corrosion inhibitor is too high, there is a risk of the conductive film 15 which is meant to be removed remaining on the insulating film 12 after polishing, due to the capability of the polishing composition to polish the copper containing metal later not being sufficient.

Ingredient (e), namely a surfactant, acts to suppress the occurrence of dishing by lowering the dishing depth. Specific examples of the surfactant include, for example, palm oil fatty acid sarcosine triethanolamine represented by chemical formula (10), palm oil fatty acid methyltaurine sodium represented by formula (11), polyoxyethylene palm oil fatty acid monoethanolamide sodium sulfate represented by chemical formula (12), polyoxyethylene alkylphenyl ether phosphate represented by chemical formula (13), dodecylbenzenesulfonate triethanolamine represented by chemical formula (14), polyoxyethylene alkyl sodium sulfosuccinate represented by chemical formula (15), dioctyl type succinates represented by chemical formula (16), polyoxyethylene lauryl ether sulfate triethanolamine represented by chemical formula (17), and diisobutyldimethylbutyne diol polyoxyethylene glycol ether represented by chemical formula (18).

The surfactant content in the polishing composition is preferably 0.025 to 0.2 mass %, and more preferably 0.03 to 0.1 mass %. When the surfactant content is less than 0.025 mass %, the dishing depth is hardly reduced, whereby there is a risk that the dishing occurrence cannot be suppressed. When the surfactant content exceeds 0.2 mass %, polishing of the copper containing metal is too strongly suppressed, whereby there is a risk that the conductive film 15 which is meant to be removed remains on the insulating film 12 after polishing.

Ingredient (f), namely an oxidant, acts to accelerate mechanical polishing using the first and second silicon oxides through oxidation of the copper containing metal. The oxidant may be a persulfate, such as ammonium persulfate, potassium persulfate, or sodium persulfate, periodic acid, peracetic acid, perchloric acid, ammonium percarbonate, or hydrogen peroxide. Among these, a persulfate is preferable in view of its strong capability of oxidizing copper, and even more preferable is ammonium persulfate.

The oxidant content in the polishing composition is preferably 0.5 to 10 mass %, and more preferably 1 to 5 mass %. When the oxidant content is less than 0.5 mass %, there is a risk that the conductive film 15 which is meant to be removed remains on the insulating film 12 after polishing due to the capability of the polishing composition to polish the copper containing metal being insufficient. When the oxidant content exceeds 10 mass %, there is a risk of the dishing depth increasing due to the capability of the polishing composition to polish the copper containing metal being too high.

Ingredient (g), namely water, acts as a medium for dissolving or dispersing the ingredients other than water that are in the polishing composition. The water preferably contains as little impurities as possible. Specific examples include pure water from which impurity ions were removed using an ion-exchange resin, and was then passed through a filter to remove foreign substances, ultra-pure water, or distilled water.

The polishing composition is prepared by adding Ingredients (a) to (f) to water, and mixing. During the mixing, a blade-type agitator or an ultrasonic dispersing apparatus can be used. The order of adding Ingredients (a) to (f) to water is not specifically limited.

The pH of the polishing composition is 7 or more, preferably 7 to 12, and most preferably 8 to 10. When the polishing composition pH is less than 7, there is a risk that the capability of the polishing composition to polish the copper containing metal deteriorates. When the polishing composition pH exceeds 12, there is a risk of the occurrence of dishing being accelerated due to the capability of the polishing composition to polish the copper containing metal being too high. The polishing composition pH may be adjusted by the addition of ammonia to the polishing composition.

When performing the chemical mechanical polishing of the second polishing process using the polishing composition according to the fourth embodiment, the polishing pad is pressed against the surface of the conductive film 15 while supplying polishing composition to the surface of conductive film 15, and rotated.

In the polishing composition according to the fourth embodiment, the occurrence of dishing is suppressed due to the action of the second silicon oxide, the corrosion inhibitor, and the surfactant in the polishing composition. In addition, the capability of the polishing composition to polish the copper containing metal improves due to the action of the first silicon oxide and the at least one selected from the group consisting of carboxylic acid and alpha-amino acid in the polishing composition.

It should be apparent to those skilled in the art that the present invention may be embodied in many other specific forms without departing from the spirit of scope of the invention. Particularly, it should be understood that the invention may be embodied in the following forms.

Each of the polishing compositions according to the first to fourth embodiments may further comprise, as necessary, a thickener, an antifoaming agent, or a preservative.

Each of the polishing compositions according to the first to fourth embodiments may be prepared by diluting the stock solution with water.

The polishing composition according to the third embodiment may be prepared and stored in a state where the persulfate is separated from the other ingredients, whereby the persulfate may be added to the other ingredients immediately before use. In such a case, the decomposition of persulfate in the polishing composition is suppressed when the polishing composition is stored for a long period of time.

As shown in FIG. 1(c), during the first polishing process, a part of the portion of the conductive film 15 that is located outside of the trench 13 may be removed by chemical mechanical polishing so that an upper surface of the barrier film 14 is exposed. Subsequently, as shown in FIG. 1(d), during the second polishing process, the remaining portion of the conductive film 15 that is located outside of the trench 13 and the portion of the barrier film 14 that is located outside of the trench 13 may be removed by chemical mechanical polishing so that an upper surface of the insulating film 12 is exposed. In such a case, the polishing compositions according to the first to fourth embodiments can be used in the chemical mechanical polishing of the first polishing process.

Examples and Comparative Examples according to the present invention will now be described.

EXAMPLES 1 TO 31 AND COMPARATIVE EXAMPLES 1 TO 11

Each ingredient shown in Table 1 was mixed with water to prepare the polishing compositions according to Examples 1 to 31 and Comparative Examples 1 to 11.

The measured results of the pH for each of the polishing compositions according to Examples 1 to 31 and Comparative Examples 1 to 11 are shown in Table 1.

The thickness of a copper blanket wafer before and after polishing was measured when a copper blanket wafer was polished in accordance with the first polishing conditions using the polishing compositions according to Examples 1 to 31 and Comparative Examples 1 to 11. Wafer thickness was measured using a sheet resistor (VR-120, manufactured by Kokusai Denki System Service K.K.). The reduction in wafer thickness as a result of the polishing was determined from wafer thickness measured before and after polishing. A polishing rate obtained by dividing the reduction in wafer thickness obtained in this way by the polishing time is shown in the "Polishing Rate" column of Table 1.

(First Polishing Conditions)

Polishing machine: Polishing machine for single-sided CMP (Mirra; manufactured by Applied Materials, Inc.)

Object to be polished: Copper blanket wafer comprising a copper film formed on an 8-inch silicon wafer by an electrolytic plating method Polishing pad: laminated polishing pad made of polyurethane (IC-1000/Suba 400, manufactured by Rodel Inc.)

Polishing pressure: 2 psi (about 13.8 kPa)

Turntable rotation speed: 60 rpm

Feed speed of polishing composition: 200 ml/min

Carrier rotation speed: 60 rpm

Polishing time: 1 minute

Copper patterned wafers were polished in accordance with the second polishing conditions using the polishing slurry "PLANERLITE-7102", manufactured by Fujimi Incorporated. Polishing was stopped when the copper film thickness of the polished copper patterned wafer had reached 70% of the copper film thickness of the copper patterned wafer prior to polishing. This process corresponds to the chemical mechanical polishing process of the first polishing process. Next, copper patterned wafers that had been subjected to the chemical mechanical polishing process of the first polishing process were polished in accordance with the first polishing conditions using the respective polishing compositions according to Examples 1 to 31 and Comparative Examples 1 to 11. Once an end point signal indicating that an upper surface of the barrier film 14 was exposed had been detected, polishing was completed after further polishing only for the extra time it took to polish the copper film to a thickness of 200 nm. This process corresponds to the chemical mechanical polishing process of the second polishing process. The dishing depth was then measured in the region in which wiring 17 had a width of 100 μm. The dishing depth was measured using the profiler HRP340 manufactured by KLA-Tencor Corporation, which is a contact-type surface measuring device. These measured results are shown in the "Dishing Depth" column of Table 1.

The amount of copper containing metal that remained on the insulting film 12 of the region wherein wiring 17 was not formed was measured for the copper patterned wafers that had been subjected to the chemical mechanical polishing process of the second polishing process. The remaining amount of copper containing metal was measured using an "OPTIPHOTO 300" differential interference microscope manufactured by Nikon Corporation. Based on the remaining amount of copper containing metal measured in this manner, each polishing composition was evaluated using the four grades of excellent (◉), good (○), acceptable (Δ), and poor (X). That is, cases where absolutely no copper containing metal residual could be seen were evaluated as excellent; cases where a small degree of patchy-shaped copper containing metal residue could be seen were evaluated as good; cases where patchy-shaped copper containing metal residue could be seen over the entire object were evaluated as acceptable; cases where a large amount of copper containing metal remained over the entire object to such an extent that wiring could not be made out were evaluated as poor. These evaluation results are shown in the "Copper Containing Metal Residue Amount" column of Table 1.

(Second Polishing Conditions)

Polishing machine: Polishing machine for single-sided CMP (Mirra; manufactured by Applied Materials, Inc.);

Object to be polished: Patterned wafer (854 mask pattern) comprising a copper film having a thickness of 1000 nm and initial concave portions 16 having an 800 nm depth (manufactured by SEMATECH, Inc.);

Polishing pad: laminated polishing pad made of polyurethane (IC-1400, manufactured by Rodel Inc.)

Polishing pressure: 2.0 psi (about 13.8 kPa)
Turntable rotation speed: 100 rpm
Feed speed of polishing composition: 200 ml/min
Carrier rotation speed: 100 rpm Copper blanket wafers were polished in accordance with the first polishing conditions using both polishing compositions directly after they had been prepared, and polishing compositions that had been stored for some time after preparation in an airtight vessel. The respective polishing rate was calculated from the wafer thickness before and after polishing, whereby based on the comparison between the two calculated polishing rates, the pot life for each polishing composition was evaluated using the four grades of excellent (◎), good (○), acceptable (Δ), and poor (X). That is, cases where the polishing rate achieved using a polishing composition that had been stored for two weeks or more was greater than 90% of the polishing rate achieved using a polishing composition directly after being prepared were evaluated as excellent; cases where the polishing rate achieved using a polishing composition that had been stored for at least one week, but less than 2 weeks, was less than 90% of the polishing rate achieved using a polishing composition directly after being prepared were evaluated as good; cases where the polishing rate achieved using a polishing composition that had been stored for at least 3 days, but less than 1 week, was less than 90% of the polishing rate achieved using a polishing composition directly after being prepared were evaluated as acceptable; and cases where the polishing rate achieved using a polishing composition that had been stored for at less than 3 days, was less than 90% of the polishing rate achieved using a polishing composition directly after being prepared were evaluated as poor. These evaluation results are shown in the "Pot Life" column of Table 1.

TABLE 1

| | Surfactant [mass percentage] | Silicon Oxide [mass percentage] | Carboxylic Acid or Alpha-amino Acid [mass percentage] | Corrosion Inhibitor [mass percentage] | Oxidant [mass percentage] | pH | Polishing Rate [nm/min] | Dishing Depth [nm] | Copper Containing Metal Residue Amount | Pot Life |
|---|---|---|---|---|---|---|---|---|---|---|
| Ex. 1 | A1 0.01% | D 0.015% | CS2 0.5% | Ala 1% | G 0.01% | APS 1% | 9.5 | 800 | 100 | ◎ | Δ |
| Ex. 2 | A1 0.02% | D 0.015% | CS2 0.5% | Ala 1% | G 0.01% | APS 1% | 9.5 | 600 | 20 | ○ | Δ |
| Ex. 3 | A1 0.05% | D 0.015% | CS2 0.5% | Ala 1% | G 0.01% | APS 1% | 9.5 | 400 | 10 | Δ | Δ |
| Ex. 4 | A1 0.1% | D 0.015% | CS2 0.5% | Ala 1% | G 0.01% | APS 1% | 9.5 | 300 | 5 | Δ | Δ |
| Ex. 5 | A1 0.02% | D 0.005% | CS2 0.5% | Ala 1% | G 0.01% | APS 1% | 9.5 | 800 | 100 | ○ | Δ |
| Ex. 6 | A1 0.02% | D 0.05% | CS2 0.5% | Ala 1% | G 0.01% | APS 1% | 9.5 | 500 | 15 | Δ | Δ |
| Ex. 7 | A1 0.02% | D 0.1% | CS2 0.5% | Ala 1% | G 0.01% | APS 1% | 9.5 | 400 | 10 | Δ | Δ |
| Ex. 8 | A1 0.035% | — | CS2 0.5% | Ala 1% | G 0.01% | APS 1% | 9.5 | 450 | 20 | ○ | Δ |
| Ex. 9 | A1 0.025% | D 0.01% | CS2 0.5% | Ala 1% | G 0.01% | APS 1% | 9.5 | 600 | 20 | Δ | Δ |
| Ex. 10 | A1 0.015% | D 0.02% | CS2 0.5% | Ala 1% | G 0.01% | APS 1% | 9.5 | 700 | 60 | Δ | Δ |
| Ex. 11 | A1 0.005% | D 0.03% | CS2 0.5% | Ala 1% | G 0.01% | APS 1% | 9.5 | 800 | 100 | ○ | Δ |
| Ex. 12 | A2 0.02% | D 0.015% | CS2 0.5% | Ala 1% | G 0.01% | APS 1% | 9.5 | 600 | 20 | ○ | Δ |
| Ex. 13 | A3 0.02% | D 0.015% | CS2 0.5% | Ala 1% | G 0.01% | APS 1% | 9.5 | 600 | 20 | ○ | Δ |
| Ex. 14 | B1 0.02% | D 0.015% | CS2 0.5% | Ala 1% | G 0.01% | APS 1% | 9.5 | 400 | 40 | ○ | ○ |
| Ex. 15 | B2 0.02% | D 0.015% | CS2 0.5% | Ala 1% | G 0.01% | APS 1% | 9.5 | 800 | 100 | ◎ | Δ |
| Ex. 16 | B2 0.12% | D 0.05% | CS2 0.5% | Ala 1% | G 0.01% | APS 1% | 9.5 | 600 | 30 | ○ | Δ |
| Ex. 17 | C1 0.02% | D 0.015% | CS2 0.5% | Ala 1% | G 0.01% | APS 1% | 9.5 | 800 | 100 | ○ | Δ |
| Ex. 18 | C1 0.06% | D 0.06% | CS2 0.5% | Ala 1% | G 0.01% | APS 1% | 9.5 | 600 | 30 | ○ | Δ |
| Ex. 19 | C2 0.02% | D 0.015% | CS2 0.5% | Ala 1% | G 0.01% | APS 1% | 9.5 | 800 | 100 | ○ | Δ |
| Ex. 20 | C2 0.09% | D 0.06% | CS2 0.5% | Ala 1% | G 0.01% | APS 1% | 9.5 | 700 | 30 | ○ | Δ |
| Ex. 21 | A1 0.02% | E 0.015% | CS2 0.5% | Ala 1% | G 0.01% | APS 1% | 9.5 | 700 | 50 | ◎ | Δ |

TABLE 1-continued

| | Surfactant [mass percentage] | Silicon Oxide [mass percentage] | Carboxylic Acid or Alpha-amino Acid [mass percentage] | Corrosion Inhibitor [mass percentage] | Oxidant [mass percentage] | pH | Polishing Rate [nm/min] | Dishing Depth [nm] | Copper Containing Metal Residue Amount | Pot Life |
|---|---|---|---|---|---|---|---|---|---|---|
| Ex. 22 | A1 0.02% | D 0.015% | CS1 0.5% | Ala 1% | G 0.01% | APS 1% | 9.5 | 550 | 15 | Δ | Δ |
| Ex. 23 | A1 0.02% | D 0.015% | CS3 0.5% | Ala 1% | G 0.01% | APS 1% | 9.5 | 650 | 50 | Δ | Δ |
| Ex. 24 | A1 0.02% | D 0.015% | FS3 0.5% | Ala 1% | G 0.01% | APS 1% | 9.5 | 600 | 45 | ○ | Δ |
| Ex. 25 | A1 0.02% | D 0.015% | CS2 0.5% | Gly 1% | G 0.01% | APS 1% | 9.5 | 800 | 50 | ○ | Δ |
| Ex. 26 | A1 0.02% | D 0.015% | CS2 0.5% | Val 1% | G 0.01% | APS 1% | 9.5 | 400 | 15 | Δ | Δ |
| Ex. 27 | A1 0.02% | D 0.015% | CS2 0.5% | Cit 1% | G 0.01% | APS 1% | 9.5 | 900 | 120 | ○ | Δ |
| Ex. 28 | A1 0.02% | D 0.015% | CS2 0.5% | Oxa 1% | G 0.01% | APS 1% | 9.5 | 400 | 120 | ○ | Δ |
| Ex. 29 | A1 0.02% | D 0.015% | CS2 0.5% | Ala 1% | H 0.0005% | APS 1% | 9.5 | 600 | 20 | ○ | Δ |
| Ex. 30 | A1 0.02% | D 0.015% | CS2 0.5% | Ala 1% | I 0.005% | APS 1% | 9.5 | 600 | 20 | ○ | Δ |
| Ex. 31 | A1 0.02% | D 0.015% | CS2 0.5% | Ala 1% | G 0.01% | HPO 1% | 9.5 | 300 | 100 | ○ | ○ |
| C. Ex. 1 | — | — | CS2 0.5% | Ala 1% | G 0.01% | APS 1% | 9.5 | 1000 | 250 | ○ | Δ |
| C. Ex. 2 | — | D 0.015% | CS2 0.5% | Ala 1% | G 0.01% | APS 1% | 9.5 | 800 | 150 | ○ | Δ |
| C. Ex. 3 | — | E 0.015% | CS2 0.5% | Ala 1% | G 0.01% | APS 1% | 9.5 | 800 | 150 | ○ | Δ |
| C. Ex. 4 | — | F 0.015% | CS2 0.5% | Ala 1% | G 0.01% | APS 1% | 9.5 | 800 | 150 | ○ | Δ |
| C. Ex. 5 | A1 0.02% | D 0.015% | — | Ala 1% | G 0.01% | APS 1% | 9.5 | 40 | — | X | Δ |
| C. Ex. 6 | A1 0.02% | D 0.015% | CS2 0.5% | — | G 0.01% | APS 1% | 9.5 | 300 | 200 | ○ | Δ |
| C. Ex. 7 | A1 0.02% | D 0.015% | CS2 0.5% | Ala 1% | — | APS 1% | 9.5 | 900 | 450 | ◎ | Δ |
| C. Ex. 8 | A1 0.02% | D 0.015% | CS2 0.5% | Ala 1% | G 0.01% | — | 9.5 | 20 | — | X | ◎ |
| C. Ex. 9 | E 0.02% | F 0.015% | CS2 0.5% | Ala 1% | G 0.01% | APS 1% | 9.5 | 800 | 450 | ◎ | Δ |
| C. Ex. 10 | E 0.02% | D 0.015% | CS2 0.5% | Ala 1% | G 0.01% | APS 1% | 9.5 | 900 | 150 | ◎ | Δ |
| C. Ex. 11 | F 0.02% | D 0.015% | CS2 0.5% | Ala 1% | G 0.01% | APS 1% | 9.5 | 1000 | 150 | ◎ | Δ |

In the "Surfactant" column of Table 1:
A1 denotes palm oil fatty acid sarcosine triethanolamine;
A2 denotes palm oil fatty acid methyltaurine sodium;
A3 denotes polyoxyethylene palm oil fatty acid monoethanolamide sodium sulfate;
B1 denotes polyoxyethylene alkylphenyl ether phosphate;
B2 denotes dodecylbenzenesulfonate triethanolamine;
C1 denotes polyoxyethylene alkyl sodium sulfosuccinate;
C2 denotes sulfosuccinate;
D denotes polyoxyethylene lauryl ether sulfate triethanolamine;
E denotes diisobutyldimethylbutyne diol polyoxyethylene glycol ether; and
F denotes polyoxyethylene polyoxypropylene alkyl ether represented by chemical formula (30).

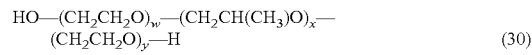

HO—(CH$_2$CH$_2$O)$_w$—(CH$_2$CH(CH$_3$)O)$_x$—(CH$_2$CH$_2$O)$_y$—H    (30)

In chemical formula (30), the sum of w and y is 164, and x is 31.

In the "Silicon Oxide" column of Table 1:
CS1 is a colloidal silica having a mean particle diameter $D_{N4}$ of 0.03 μm;

CS2 is a colloidal silica having a mean particle diameter $D_{N4}$ of 0.05 μm;

CS3 is a colloidal silica having a mean particle diameter $D_{N4}$ of 0.07 μm; and FS3 is a fumed silica having a mean particle diameter $D_{N4}$ of 0.07 μm.

The mean particle diameter $D_{N4}$ of the silicon dioxide was measured using an N4 Plus Submicron Particle Sizer manufactured by Beckman Coulter, Inc. The total content of iron, nickel copper, chromium, zinc and calcium in a 20 mass % aqueous solution of colloidal silica was not more than 20 ppb.

In the "Carboxylic Acid or Alpha-amino Acid" column of Table 1:

Ala denotes alanine;

Gly denotes glycine;

Val denotes valine;

Cit denotes citric acid; and

Oxa denotes oxalic acid.

In the "Corrosion Inhibitor" column of Table 1:
G denotes 1-(2,3-dihydroxypropyl)benzotriazole;
H denotes 1-[N,N-bis(hydroxyethyl)aminomethyl] benzotriazole; and
I denotes 1-(1,2-dicarboxyethyl) benzotriazole.
In the "Oxidant" column of Table 1:
APS denotes ammonium persulfate; and
HPO denotes hydrogen peroxide.

As shown in Table 1, it was learned that in Examples 1 to 31 dishing depth is small and the occurrence of dishing is suppressed. It was also learned that the capability of the polishing composition according to Examples 1 to 31 to polish a copper containing metal is high.

The polishing compositions according to Examples 1 to 4, in which the content of a compound selected from a first group was from 0.05 to 0.1 mass %, and the polishing compositions according to Examples 5 to 7, in which the content of a compound selected from a second group was from 0.05 to 0.1 mass %, had a high capability to polish a copper containing metal, yet could dramatically reduce dishing depth.

EXAMPLES 101 TO 133 AND COMPARATIVE EXAMPLES 101 TO 116

Each ingredient shown in Table 2 was mixed with water to prepare the polishing compositions of Examples 101 to 133 and Comparative Examples 101 to 116.

The measured results of the pH for each of the polishing compositions according to Examples 101 to 133 and Comparative Examples 101 to 116 are shown in Table 2.

The thickness of a copper blanket wafer before and after polishing was measured when a copper blanket wafer was polished in accordance with the first polishing conditions using the polishing compositions according to Examples 101 to 133 and Comparative Examples 101 to 116. Wafer thickness was measured using a sheet resistor (VR-120, manufactured by Kokusai Denki System Service K.K.). The reduction in wafer thickness as a result of the polishing was determined from the wafer thickness measured before and after polishing. A polishing rate obtained by dividing the reduction in wafer thickness obtained in this way by the polishing time is shown in the "Polishing Rate" column of Table 2.

Copper patterned wafers were polished in accordance with the second polishing conditions using the polishing slurry "PLANERLITE-7102", manufactured by Fujimi Incorporated. Polishing was stopped when the copper film thickness of the polished copper patterned wafer had reached 70% of the copper film thickness of the copper patterned wafer prior to polishing. This process corresponds to the chemical mechanical polishing process of the first polishing process. Next, copper patterned wafers that had been subjected to the chemical mechanical polishing process of the first polishing process were polished in accordance with the first polishing conditions using the respective polishing compositions according to Examples 101 to 133 and Comparative Examples 101 to 116. Once an end point signal indicating that an upper surface of the barrier 14 was exposed had been detected, polishing was completed after further polishing only for the extra time it took to polish the copper film to a thickness of 200 nm. This process corresponds to the chemical mechanical polishing process of the second polishing process. The dishing depth was then measured in the region in which wiring 17 had a width of 100 µm. The dishing depth was measured using the profiler HRP340 manufactured by KLA-Tencor Corporation, which is a contact-type surface measuring device. These measured results are shown in the "Dishing Depth" column of Table 2.

The amount of copper containing metal that remained on the insulting film 12 of the region wherein wiring 17 was not formed was measured for the copper patterned wafers that had been subjected to the chemical mechanical polishing process of the second polishing process. The remaining amount of copper containing metal was measured using a "OPTIPHOTO 300" differential interference microscope manufactured by Nikon Corporation. Based on the remaining amount of copper containing metal measured in this manner, each polishing composition was evaluated using the four grades of excellent (◎), good (○), acceptable (Δ), and poor (X). That is, cases where absolutely no copper containing metal residual could be seen were evaluated as excellent; cases where a small degree of patchy-shaped copper containing metal residue could be seen were evaluated as good; cases where patchy-shaped copper containing metal residue could be seen over the entire object were evaluated as good; cases where a large amount of copper containing metal remained over the entire object to such an extent that wiring could not be made out were evaluated as poor. These evaluation results are shown in the "Copper Containing Metal Residue Amount" column of Table 2.

Copper blanket wafers were polished in accordance with the first polishing conditions using both polishing compositions directly after they had been prepared, and polishing compositions that had been stored for some time after preparation in an airtight vessel. The respective polishing rate was calculated from the wafer thickness before and after polishing, whereby based on the comparison between the two calculated polishing rates, the pot life for each polishing composition was evaluated using the four grades of excellent (◎), good (○), acceptable (Δ), and poor (X). That is, cases where the polishing rate achieved using a polishing composition that had been stored for two weeks or more was greater than 90% of the polishing rate achieved using a polishing composition directly after being prepared were evaluated as excellent; cases where the polishing rate achieved using a polishing composition that had been stored for at least one week, but less than 2 weeks, was less than 90% of the polishing rate achieved using a polishing composition directly after being prepared were evaluated as good; cases where the polishing rate achieved using a polishing composition that had been stored for at least 3 days, but less than 1 week, was less than 90% of the polishing rate achieved using a polishing composition directly after being prepared were evaluated as acceptable; and cases where the polishing rate achieved using a polishing composition that had been stored for at less than 3 days, was less than 90% of the polishing rate achieved using a polishing composition directly after being prepared were evaluated as poor. These evaluation results are shown in the "Pot Life" column of Table 2.

TABLE 2

| | Alpha-amino Acid or Polishing Accelerator in place thereof [mass percentage] | Benzotriazole Derivative or Corrosion Inhibitor in place thereof [mass percentage] | Silicon Oxide [mass percentage] | Surfactant [mass percentage] | | Oxidant [mass percentage] | pH | Polishing Rate [nm/min] | Dishing Depth [nm] | Copper Containing Metal Residue Amount | Pot Lite |
|---|---|---|---|---|---|---|---|---|---|---|---|
| Ex. 101 | Ala 0.01% | G 0.01% | CS2 0.5% | A1 0.02% | D 0.015% | APS 1% | 9.5 | 1000 | 100 | ○ | Δ |
| Ex. 102 | Ala 0.5% | G 0.01% | CS2 0.5% | A1 0.02% | D 0.015% | APS 1% | 9.5 | 800 | 60 | ○ | Δ |
| Ex. 103 | Ala 1% | G 0.01% | CS2 0.5% | A1 0.02% | D 0.015% | APS 1% | 9.5 | 600 | 20 | ○ | Δ |
| Ex. 104 | Ala 1.5% | G 0.01% | CS2 0.5% | A1 0.02% | D 0.015% | APS 1% | 9.5 | 400 | 20 | ○ | Δ |
| Ex. 105 | Ala 2% | G 0.01% | CS2 0.5% | A1 0.02% | D 0.015% | APS 1% | 9.5 | 200 | 15 | Δ | Δ |
| Ex. 106 | Ala 1% | G 0.001% | CS2 0.5% | A1 0.02% | D 0.015% | APS 1% | 9.5 | 800 | 100 | ○ | Δ |
| Ex. 107 | Ala 1% | G 0.005% | CS2 0.5% | A1 0.02% | D 0.015% | APS 1% | 9.5 | 700 | 70 | ○ | Δ |
| Ex. 108 | Ala 1% | G 0.02% | CS2 0.5% | A1 0.02% | D 0.015% | APS 1% | 9.5 | 300 | 15 | Δ | Δ |
| Ex. 109 | Gly 1% | G 0.01% | CS2 0.5% | A1 0.02% | D 0.015% | APS 1% | 9.5 | 800 | 50 | ○ | Δ |
| Ex. 110 | Val 1% | G 0.01% | CS2 0.5% | A1 0.02% | D 0.015% | APS 1% | 9.5 | 400 | 15 | Δ | Δ |
| Ex. 111 | Ala 1% | H 0.0001% | CS2 0.5% | A1 0.02% | D 0.015% | APS 1% | 9.5 | 800 | 100 | ○ | Δ |
| Ex. 112 | Ala 1% | H 0.0005% | CS2 0.5% | A1 0.02% | D 0.015% | APS 1% | 9.5 | 600 | 20 | ○ | Δ |
| Ex. 113 | Ala 1% | H 0.001% | CS2 0.5% | A1 0.02% | D 0.015% | APS 1% | 9.5 | 300 | 15 | Δ | Δ |
| Ex. 114 | Ala 1% | I 0.001% | CS2 0.5% | A1 0.02% | D 0.015% | APS 1% | 9.5 | 800 | 100 | ○ | Δ |
| Ex. 115 | Ala 1% | I 0.005% | CS2 0.5% | A1 0.02% | D 0.015% | APS 1% | 9.5 | 600 | 20 | ○ | Δ |
| Ex. 116 | Ala 1% | I 0.01% | CS2 0.5% | A1 0.02% | D 0.015% | APS 1% | 9.5 | 300 | 15 | Δ | Δ |
| Ex. 117 | Gly 1% | H 0.0005% | CS2 0.5% | A1 0.02% | D 0.015% | APS 1% | 9.5 | 800 | 50 | ○ | Δ |
| Ex. 118 | Val 1% | H 0.0005% | CS2 0.5% | A1 0.02% | D 0.015% | APS 1% | 9.5 | 400 | 15 | Δ | Δ |
| Ex. 119 | Gly 1% | I 0.005% | CS2 0.5% | A1 0.02% | D 0.015% | APS 1% | 9.5 | 800 | 50 | ○ | Δ |
| Ex. 120 | Val 1% | I 0.005% | CS2 0.5% | A1 0.02% | D 0.015% | APS 1% | 9.5 | 400 | 15 | Δ | Δ |
| Ex. 121 | Ala 1% | G 0.01% | CS2 0.5% | A2 0.02% | D 0.015% | APS 1% | 9.5 | 600 | 20 | ○ | Δ |
| Ex. 122 | Ala 1% | G 0.01% | CS2 0.5% | A3 0.02% | D 0.015% | APS 1% | 9.5 | 600 | 20 | ○ | Δ |
| Ex. 123 | Ala 1% | G 0.01% | CS2 0.5% | B1 0.02% | D 0.015% | APS 1% | 9.5 | 400 | 40 | ○ | ○ |
| Ex. 124 | Ala 1% | G 0.01% | CS2 0.5% | B2 0.02% | D 0.015% | APS 1% | 9.5 | 800 | 100 | ◎ | Δ |
| Ex. 125 | Ala 1% | G 0.01% | CS2 0.5% | C1 0.02% | D 0.015% | APS 1% | 9.5 | 800 | 100 | ○ | Δ |
| Ex. 126 | Ala 1% | G 0.01% | CS2 0.5% | C2 0.02% | D 0.015% | APS 1% | 9.5 | 800 | 100 | ○ | Δ |
| Ex. 127 | Ala 1% | G 0.01% | CS2 0.5% | A1 0.035% | — | APS 1% | 9.5 | 450 | 20 | ○ | Δ |
| Ex. 128 | Ala 1% | G 0.01% | CS2 0.5% | A1 0.02% | E 0.015% | APS 1% | 9.5 | 700 | 50 | ○ | Δ |
| Ex. 129 | Ala 1% | G 0.01% | CS2 0.5% | B2 0.02% | E 0.015% | APS 1% | 9.5 | 800 | 100 | ◎ | Δ |
| Ex. 130 | Ala 1% | G 0.01% | CS1 0.5% | A1 0.02% | D 0.015% | APS 1% | 9.5 | 550 | 15 | Δ | Δ |
| Ex. 131 | Ala 1% | G 0.01% | CS3 0.5% | A1 0.02% | D 0.015% | APS 1% | 9.5 | 650 | 50 | Δ | Δ |
| Ex. 132 | Ala 1% | G 0.01% | FS3 0.5% | A1 0.02% | D 0.015% | APS 1% | 9.5 | 600 | 45 | ○ | Δ |
| Ex. 133 | Ala 1% | G 0.01% | CS2 0.5% | A1 0.02% | D 0.015% | HPO 1% | 9.5 | 300 | 100 | ○ | ○ |
| C. Ex. 101 | — | — | CS2 0.5% | A1 0.02% | D 0.015% | APS 1% | 9.5 | 100 | — | X | Δ |
| C. Ex. 102 | — | G 0.01% | CS2 0.5% | A1 0.02% | D 0.015% | APS 1% | 9.5 | 300 | 200 | ○ | Δ |
| C. Ex. 103 | — | J 0.01% | CS2 0.5% | A1 0.02% | D 0.015% | APS 1% | 9.5 | 10 | — | X | Δ |

TABLE 2-continued

| | Alpha-amino Acid or Polishing Accelerator in place thereof [mass percentage] | Benzotriazole Derivative or Corrosion Inhibitor in place thereof [mass percentage] | Silicon Oxide [mass percentage] | Surfactant [mass percentage] | | Oxidant [mass percentage] | pH | Polishing Rate [nm/min] | Dishing Depth [nm] | Copper Containing Metal Residue Amount | Pot Lite |
|---|---|---|---|---|---|---|---|---|---|---|---|
| C. Ex. 104 | Ala 1% | — | CS2 0.5% | A1 0.02% | D 0.015% | APS 1% | 9.5 | 900 | 450 | ◎ | Δ |
| C. Ex. 105 | Gly 1% | — | CS2 0.5% | A1 0.02% | D 0.015% | APS 1% | 9.5 | 1100 | 450 | ◎ | Δ |
| C. Ex. 106 | Ala 1% | J 0.01% | CS2 0.5% | A1 0.02% | D 0.015% | APS 1% | 9.5 | 10 | — | X | Δ |
| C. Ex. 107 | Gly 1% | J 0.01% | CS2 0.5% | A1 0.02% | D 0.015% | APS 1% | 9.5 | 20 | — | X | Δ |
| C. Ex. 108 | Ala 1% | G 0.01% | CS2 0.5% | — | — | APS 1% | 9.5 | 1000 | 250 | ○ | Δ |
| C. Ex. 109 | Gly 1% | J 0.01% | CS2 0.5% | — | — | APS 1% | 9.5 | 1200 | 300 | ○ | Δ |
| C. Ex. 110 | Ala 1% | G 0.01% | — | A1 0.02% | D 0.015% | APS 1% | 9.5 | 40 | — | X | Δ |
| C. Ex. 111 | Ala 1% | G 0.01% | CS2 0.5% | A1 0.02% | D 0.015% | — | 9.5 | 20 | — | X | ◎ |
| C. Ex. 112 | Cit 1% | G 0.01% | CS2 0.5% | A1 0.02% | D 0.015% | APS 1% | 9.5 | 900 | 120 | ○ | Δ |
| C. Ex. 113 | LA 1% | G 0.01% | CS2 0.5% | A1 0.02% | D 0.015% | APS 1% | 9.5 | 90 | 150 | ○ | Δ |
| C. Ex. 114 | Oxa 1% | G 0.01% | CS2 0.5% | A1 0.02% | D 0.015% | APS 1% | 9.5 | 400 | 120 | ○ | Δ |
| C. Ex. 115 | NA 1% | G 0.01% | CS2 0.5% | A1 0.02% | D 0.015% | APS 1% | 9.5 | 100 | 150 | ○ | Δ |
| C. Ex. 116 | SA 1% | G 0.01% | CS2 0.5% | A1 0.02% | D 0.015% | APS 1% | 9.5 | 120 | 150 | ○ | Δ |

In the "Alpha-amino Acid or Polishing Accelerator in place thereof" column of Table 2:
Ala denotes alanine;
Gly denotes glycine;
Val denotes valine;
Cit denotes citric acid;
LA denotes lactic acid;
Oxa denotes oxalic acid;
NA denotes nitric acid; and
SA denotes sulfuric acid.

In the "Benzotriazole Derivative or Corrosion Inhibitor in place thereof" column of Table 2:
G denotes 1-(2,3-dihydroxypropyl)benzotriazole;
H denotes 1-[N,N-bis(hydroxyethyl)aminomethyl] benzotriazole;
I denotes 1-(1,2-dicarboxyethyl) benzotriazole; and
J denotes benzotriazole.

In the "Silicon Oxide" column of Table 2:
CS1 is a colloidal silica having a mean particle diameter $D_{N4}$ of 0.03 μm;
CS2 is a colloidal silica having a mean particle diameter $D_{N4}$ of 0.05 μm;
CS3 is a colloidal silica having a mean particle diameter $D_{N4}$ of 0.07 μm; and
FS3 is a fumed silica having a mean particle diameter $D_{N4}$ of 0.07 μm.

The mean particle diameter $D_{N4}$ of the silicon dioxide was measured using an N4 Plus Submicron Particle Sizer manufactured by Beckman Coulter, Inc. The total content of iron, nickel copper, chromium, zinc and calcium in a 20 mass % aqueous solution of colloidal silica was not more than 20 ppb.

In the "Surfactant" column of Table 2:
A1 denotes palm oil fatty acid sarcosine triethanolamine;
A2 denotes palm oil fatty acid methyltaurine sodium;
A3 denotes polyoxyethylene palm oil fatty acid monoethanolamide sodium sulfate;
B1 denotes polyoxyethylene alkylphenyl ether phosphate;
B2 denotes dodecylbenzenesulfonate triethanolamine;
C1 denotes polyoxyethylene alkyl sodium sulfosuccinate;
C2 denotes sulfosuccinate;
D denotes polyoxyethylene lauryl ether sulfate triethanolamine; and
E denotes diisobutyldimethylbutyne diol polyoxyethylene glycol ether.

In the "oxidant" column of Table 2:
APS denotes ammonium persulfate; and
HPO denotes hydrogen peroxide.

As shown in Table 2, it was learned that in Examples 101 to 133, dishing depth is small and the occurrence of dishing is suppressed. It was also learned that the capability of the polishing composition according to Examples 101 to 133 to polish a copper containing metal is high.

The polishing compositions according to Examples 1 to 5, in which the content of alpha-amino acid was from 0.5 to 1.5 mass %, had a high capability to polish a copper containing metal, yet could dramatically reduce dishing depth. The polishing compositions according to Examples 6 to 8, in which the content of benzotriazole derivative was from 0.005 to 0.02 mass %, could dramatically reduce dishing depth.

EXAMPLES 201 TO 235 AND COMPARATIVE EXAMPLES 201 TO 214

Each ingredient shown in Table 3 was mixed with water to prepare the polishing compositions of Examples 201 to 235 and Comparative Examples 201 to 214. A pH modifier was added to each polishing composition in just the amount to adjust the pH for the polishing compositions to the values shown in Table 3. A mixture of sodium hydroxide and 0.03 mass % ammonia was added as the pH modifier to the polishing composition of Example 214. A mixture of sodium hydroxide and 0.5 mass % ammonium carbonate was added as the pH modifier to the polishing composition of Example 215.

The thickness of a copper blanket wafer before and after polishing was measured when a copper blanket wafer was polished in accordance with the first polishing conditions using the polishing compositions according to Examples 201 to 235 and Comparative Examples 201 to 214. Wafer thickness was measured using a sheet resistor (VR-120, manufactured by Kokusai Denki System Service K.K.). The reduction in wafer thickness as a result of the polishing was determined from the wafer thickness measured before and after polishing. A polishing rate obtained by dividing the reduction in wafer thickness obtained in this way by the polishing time is shown in the "Polishing Rate" column of Table 3.

Copper patterned wafers were polished in accordance with the second polishing conditions using the polishing slurry "PLANERLITE-7102", manufactured by Fujimi Incorporated. Polishing was stopped when the copper film thickness of the polished copper patterned wafer had reached 70% of the copper film thickness of the copper patterned wafer prior to polishing. This process corresponds to the chemical mechanical polishing process of the first polishing process. Next, copper patterned wafers that had been subjected to the chemical mechanical polishing process of the first polishing process were polished in accordance with the first polishing conditions using the respective polishing compositions according to Examples 201 to 235 and Comparative Examples 201 to 214. Once an end point signal indicating that an upper surface of the barrier 14 was exposed had been detected, polishing was completed after further polishing only for the extra time it took to polish the copper film to a thickness of 200 nm. This process corresponds to the chemical mechanical polishing process of the second polishing process. The dishing depth was then measured in the region in which wiring 17 had a width of 100 μm. The dishing depth was measured using the profiler HRP340 manufactured by KLA-Tencor Corporation, which is a contact-type surface measuring device. These measured results are shown in the "Dishing Depth" column of Table 3. The "-" (hyphens) in this column indicates that measurement of the dishing depth was impossible because the wafer had not been polished.

The amount of copper containing metal that remained on the insulting film 12 of the region wherein wiring 17 was not formed was measured for the copper patterned wafers that had been subjected to the chemical mechanical polishing process of the second polishing process. The remaining amount of copper containing metal was measured using an "OPTIPHOTO 300" differential interference microscope manufactured by Nikon Corporation. Based on the remaining amount of copper containing metal measured in this manner, each polishing composition was evaluated using the four grades of excellent (⊚), good (◯), acceptable (Δ), and poor (X). That is, cases where absolutely no copper containing metal residual could be seen were evaluated as excellent; cases where a small degree of patchy-shaped copper containing metal residue could be seen were evaluated as good; cases where patchy-shaped copper containing metal residue could be seen over the entire object were evaluated as good; cases where a large amount of copper containing metal remained over the entire object to such an extent that wiring could not be made out were evaluated as poor. These evaluation results are shown in the "Copper Containing Metal Residue Amount" column of Table 3.

Copper blanket wafers were polished in accordance with the first polishing conditions using both polishing compositions directly after they had been prepared, and polishing compositions that had been stored for some time after preparation in an airtight vessel. The respective polishing rate was calculated from the wafer thickness before and after polishing, whereby based on the comparison between the two calculated polishing rates, the pot life for each polishing composition was evaluated using the four grades of excellent (⊚), good (◯), acceptable (Δ), and poor (X). That is, cases where the polishing rate achieved using a polishing composition that had been stored for two weeks or more was greater than 90% of the polishing rate achieved using a polishing composition directly after being prepared were evaluated as excellent; cases where the polishing rate achieved using a polishing composition that had been stored for at least one week, but less than 2 weeks, was less than 90% of the polishing rate achieved using a polishing composition directly after being prepared were evaluated as good; cases where the polishing rate achieved using a polishing composition that had been stored for at least 3 days, but less than 1 week, was less than 90% of the polishing rate achieved using a polishing composition directly after being prepared were evaluated as acceptable; and cases where the polishing rate achieved using a polishing composition that had been stored for at less than 3 days, was less than 90% of the polishing rate achieved using a polishing composition directly after being prepared were evaluated as poor. These evaluation results are shown in the "Pot Life" column of Table 3.

TABLE 3

| | Silicon Oxide [mass percentage] | Carboxylic Acid or Alpha-amino Acid [mass percentage] | Corrosion Inhibitor [mass percentage] | Surfactant [mass percentage] | | Persulfate or Oxidant in place thereof [mass percentage] | pH modifier | pH | Dishing Depth [nm] | Polishing Rate [nm/min] | Copper Containing Metal Residue Amount | Pot Life |
|---|---|---|---|---|---|---|---|---|---|---|---|---|
| Ex. 201 | CS2 0.5% | Ala 1% | G 0.01% | A1 0.02% | D1 0.015% | APS 1% | KOH | 8.0 | 20 | 150 | Δ | Δ |
| Ex. 202 | CS2 0.5% | Ala 1% | G 0.01% | A1 0.02% | D1 0.015% | APS 1% | KOH | 8.5 | 20 | 250 | Δ | Δ |
| Ex. 203 | CS2 0.5% | Ala 1% | G 0.01% | A1 0.02% | D1 0.015% | APS 1% | KOH | 9 | 20 | 500 | ◯ | Δ |
| Ex. 204 | CS2 0.5% | Ala 1% | G 0.01% | A1 0.02% | D1 0.015% | APS 1% | KOH | 9.5 | 20 | 600 | ◯ | Δ |
| Ex. 205 | CS2 0.5% | Ala 1% | G 0.01% | A1 0.02% | D1 0.015% | APS 1% | KOH | 10 | 20 | 650 | ◯ | Δ |

TABLE 3-continued

| | Silicon Oxide [mass percentage] | Carboxylic Acid or Alpha-amino Acid [mass percentage] | Corrosion Inhibitor [mass percentage] | Surfactant [mass percentage] | | Persulfate or Oxidant in place thereof [mass percentage] | pH modifier | pH | Dishing Depth [nm] | Polishing Rate [nm/min] | Copper Containing Metal Residue Amount | Pot Life |
|---|---|---|---|---|---|---|---|---|---|---|---|---|
| Ex. 206 | CS2 0.5% | Ala 1% | G 0.01% | A1 0.02% | D1 0.015% | APS 1% | KOH | 11 | 40 | 550 | ○ | Δ |
| Ex. 207 | CS2 0.5% | Ala 1% | G 0.01% | A1 0.02% | D1 0.015% | APS 1% | NaOH | 9.5 | 20 | 600 | ○ | Δ |
| Ex. 208 | CS2 0.5% | Ala 1% | G 0.01% | A1 0.02% | D1 0.015% | APS 1% | $NH_3$ | 9.5 | 30 | 750 | ○ | Δ |
| Ex. 209 | CS2 0.5% | Ala 1% | G 0.01% | A1 0.02% | D1 0.015% | KPS 1% | $NH_3$ | 9.5 | 25 | 600 | ○ | Δ |
| Ex. 210 | CS2 0.5% | Ala 1% | G 0.01% | A1 0.02% | D1 0.015% | NPS 1% | $NH_3$ | 9.5 | 25 | 600 | ○ | Δ |
| Ex. 211 | CS2 0.5% | Ala 1% | G 0.01% | A1 0.02% | D1 0.015% | KPS 1% | $NH_3$ | 9.5 | 25 | 600 | ○ | Δ |
| Ex. 212 | CS2 0.5% | Ala 1% | G 0.01% | A1 0.02% | D1 0.015% | KPS 1% | $NH_3$ | 9.8 | 30 | 600 | Δ | Δ |
| Ex. 213 | CS2 0.5% | Ala 1% | G 0.01% | A1 0.02% | D1 0.015% | KPS 1% | $NH_3$ | 10 | 40 | 450 | Δ | Δ |
| Ex. 214 | CS2 0.5% | Ala 1% | G 0.01% | A1 0.02% | D1 0.015% | KPS 1% | KOH/ $NH_3$ | 9.5 | 10 | 250 | Δ | Δ |
| Ex. 215 | CS2 0.5% | Ala 1% | G 0.01% | A1 0.02% | D1 0.015% | KPS 1% | KOH/ $(NH_4)_2CO_3$ | 9.5 | 30 | 550 | ○ | Δ |
| Ex. 216 | CS2 0.5% | Ala 1% | G 0.01% | A1 0.02% | D1 0.015% | APS 1.5% | KOH | 9.5 | 40 | 620 | ◎ | Δ |
| Ex. 217 | CS2 0.5% | Ala 1% | G 0.01% | A1 0.02% | D1 0.015% | APS 2% | KOH | 9.5 | 80 | 650 | ◎ | Δ |
| Ex. 218 | CS1 0.5% | Ala 1% | G 0.01% | A1 0.02% | D1 0.015% | APS 1% | KOH | 9.5 | 15 | 550 | Δ | Δ |
| Ex. 219 | CS3 0.5% | Ala 1% | G 0.01% | A1 0.02% | D1 0.015% | APS 1% | KOH | 9.5 | 50 | 650 | Δ | Δ |
| Ex. 220 | FS3 0.5% | Ala 1% | G 0.01% | A1 0.02% | D1 0.015% | APS 1% | KOH | 9.5 | 45 | 600 | ○ | Δ |
| Ex. 221 | CS2 0.5% | Gly 1% | G 0.01% | A1 0.02% | D1 0.015% | APS 1% | KOH | 9.5 | 50 | 800 | ○ | Δ |
| Ex. 222 | CS2 0.5% | Val 1% | G 0.01% | A1 0.02% | D1 0.015% | APS 1% | KOH | 9.5 | 15 | 400 | Δ | Δ |
| Ex. 223 | CS2 0.5% | Cit 1% | G 0.01% | A1 0.02% | D1 0.015% | APS 1% | KOH | 9.5 | 120 | 900 | ○ | Δ |
| Ex. 224 | CS2 0.5% | Oxa 1% | G 0.01% | A1 0.02% | D1 0.015% | APS 1% | KOH | 9.5 | 120 | 400 | ○ | Δ |
| Ex. 225 | CS2 0.5% | Ala 1% | H 0.0005% | A1 0.02% | D1 0.015% | APS 1% | KOH | 9.5 | 20 | 600 | ○ | Δ |
| Ex. 226 | CS2 0.5% | Ala 1% | I 0.005% | A1 0.02% | D1 0.015% | APS 1% | KOH | 9.5 | 20 | 600 | ○ | Δ |
| Ex. 227 | CS2 0.5% | Ala 1% | G 0.01% | A2 0.02% | D1 0.015% | APS 1% | KOH | 9.5 | 20 | 600 | ○ | Δ |
| Ex. 228 | CS2 0.5% | Ala 1% | G 0.01% | A3 0.02% | D1 0.015% | APS 1% | KOH | 9.5 | 20 | 600 | ○ | Δ |
| Ex. 229 | CS2 0.5% | Ala 1% | G 0.01% | B1 0.02% | D1 0.015% | APS 1% | KOH | 9.5 | 40 | 400 | ○ | ○ |
| Ex. 230 | CS2 0.5% | Ala 1% | G 0.01% | B2 0.02% | D1 0.015% | APS 1% | KOH | 9.5 | 100 | 800 | ◎ | Δ |
| Ex. 231 | CS2 0.5% | Ala 1% | G 0.01% | C1 0.02% | D1 0.015% | APS 1% | KOH | 9.5 | 100 | 800 | ○ | Δ |
| Ex. 232 | CS2 0.5% | Ala 1% | G 0.01% | C2 0.02% | D1 0.015% | APS 1% | KOH | 9.5 | 100 | 800 | ○ | Δ |
| Ex. 233 | CS2 0.5% | Ala 1% | G 0.01% | A1 0.035% | — | APS 1% | KOH | 9.5 | 20 | 450 | ○ | Δ |
| Ex. 234 | CS2 0.5% | Ala 1% | G 0.01% | A1 0.02% | E 0.015% | APS 1% | KOH | 9.5 | 50 | 700 | ○ | Δ |
| Ex. 235 | CS2 0.5% | Ala 1% | G 0.01% | B1 0.02% | E 0.015% | APS 1% | KOH | 9.5 | 100 | 800 | ◎ | Δ |
| C. Ex. 201 | CS2 0.5% | Ala 1% | G 0.01% | A1 0.02% | D1 0.015% | APS 1% | — | 4.5 | — | 20 | X | Δ |
| C. Ex. 202 | CS2 0.5% | Ala 1% | G 0.01% | A1 0.02% | D1 0.015% | APS 1% | $HNO_3$ | 5 | — | 20 | X | Δ |
| C. Ex. 203 | CS2 0.5% | Ala 1% | G 0.01% | A1 0.02% | D1 0.015% | APS 1% | $HNO_3$ | 3 | — | 90 | X | Δ |
| C. Ex. 204 | CS2 0.5% | Ala 1% | G 0.01% | A1 0.02% | D1 0.015% | APS 1% | KOH | 12 | 200 | 700 | ○ | Δ |
| C. Ex. 205 | CS2 0.5% | Ala 1% | G 0.01% | A1 0.02% | D1 0.015% | — | KOH | 9.5 | — | 20 | X | ◎ |
| C. Ex. 206 | CS2 0.5% | Ala 1% | G 0.01% | A1 0.02% | D1 0.015% | KPS 1% | KOH | 9.5 | — | 50 | X | Δ |

TABLE 3-continued

| | Silicon Oxide [mass percentage] | Carboxylic Acid or Alpha-amino Acid [mass percentage] | Corrosion Inhibitor [mass percentage] | Surfactant [mass percentage] | | Persulfate or Oxidant in place thereof [mass percentage] | pH modifier | pH | Dishing Depth [nm] | Polishing Rate [nm/min] | Copper Containing Metal Residue Amount | Pot Life |
|---|---|---|---|---|---|---|---|---|---|---|---|---|
| C. Ex. 207 | CS2 0.5% | Ala 1% | G 0.01% | A1 0.02% | D1 0.015% | NPS 1% | KOH | 9.5 | — | 50 | X | Δ |
| C. Ex. 208 | CS2 0.5% | Ala 1% | G 0.01% | A1 0.02% | D1 0.015% | PIA 1% | KOH | 9.5 | 400 | 400 | ◎ | Δ |
| C. Ex. 209 | CS2 0.5% | Ala 1% | G 0.01% | A1 0.02% | D1 0.015% | PAA 1% | KOH | 9.5 | 300 | 300 | ◎ | Δ |
| C. Ex. 210 | CS2 0.5% | Ala 1% | G 0.01% | A1 0.02% | D1 0.015% | PCA 1% | KOH | 9.5 | — | 20 | X | Δ |
| C. Ex. 211 | — | Ala 1% | G 0.01% | A1 0.02% | D1 0.015% | APS 1% | KOH | 9.5 | — | 40 | X | Δ |
| C. Ex. 212 | CS2 0.5% | — | G 0.01% | A1 0.02% | D1 0.015% | APS 1% | KOH | 9.5 | 200 | 300 | ○ | Δ |
| C. Ex. 213 | CS2 0.5% | Ala 1% | — | A1 0.02% | D1 0.015% | APS 1% | KOH | 9.5 | 450 | 900 | ◎ | Δ |
| C. Ex. 214 | CS2 0.5% | Ala 1% | G 0.01% | — | — | APS 1% | KOH | 9.5 | 250 | 1000 | ○ | Δ |

In the "Silicon Oxide" column of Table 3:

CS1 is a colloidal silica having a mean particle diameter $D_{N4}$ of 0.03 μm;

CS2 is a colloidal silica having a mean particle diameter $D_{N4}$ of 0.05 μm;

CS3 is a colloidal silica having a mean particle diameter $D_{N4}$ of 0.07 μm; and FS3 is a fumed silica having a mean particle diameter $D_{N4}$ of 0.07 μm.

The mean particle diameter $D_{N4}$ of the silicon dioxide was measured using an N4 Plus Submicron Particle Sizer manufactured by Beckman Coulter, Inc. The total content of iron, nickel copper, chromium, zinc and calcium in a 20 mass % aqueous solution of colloidal silica was not more than 20 ppb.

In the "Carboxylic Acid or Alpha-amino Acid" column of Table 3:

Ala denotes alanine;
Gly denotes glycine;
Val denotes valine;
Cit denotes citric acid; and
Oxa denotes oxalic acid In the "Corrosion Inhibitor" column of Table 3:

G denotes 1-(2,3-dihydroxypropyl)benzotriazole;
H denotes 1-[N,N-bis(hydroxyethyl)aminomethyl] benzotriazole; and
I denotes 1-(1,2-dicarboxyethyl) benzotriazole.

In the "Surfactant" column of Table 3:

A1 denotes palm oil fatty acid sarcosine triethanolamine;
A2 denotes palm oil fatty acid methyltaurine sodium;
A3 denotes polyoxyethylene palm oil fatty acid monoethanolamide sodium sulfate;
B1 denotes polyoxyethylene alkylphenyl ether phosphate;
B2 denotes dodecylbenzenesulfonate triethanolamine;
C1 denotes polyoxyethylene alkyl sodium sulfosuccinate;
C2 denotes sulfosuccinate;
D1 denotes polyoxyethylene lauryl ether sulfate triethanolamine; and
E denotes diisobutyldimethylbutyne diol polyoxyethylene glycol ether.

In the "Persulfate or Oxidant in place thereof" column of Table 3:

APS denotes ammonium persulfate;
KPS denotes potassium persulfate;
NPS denotes sodium persulfate;
PIA denotes periodic acid;
PAA denotes peracetic acid; and
PCA denotes perchloric acid.

As shown in Table 3, it was learned that in Examples 201 to 235, dishing depth is small and the occurrence of dishing is suppressed. It was also learned that the capability of the polishing composition according to Examples 201 to 235 to polish a copper containing metal is high.

EXAMPLES 301 TO 313 AND COMPARATIVE EXAMPLES 301 TO 315

Each ingredient shown in Table 4 was mixed with water to prepare the polishing compositions of Examples 301 to 313 and Comparative Examples 301 to 315. The pH for each polishing composition was adjusted to pH 9.5 by adding sodium hydroxide.

The thickness of a copper blanket wafer before and after polishing was measured when a copper blanket wafer was polished in accordance with the first polishing conditions using the polishing compositions according to Examples 301 to 313 and Comparative Examples 301 to 315. Wafer thickness was measured using a sheet resistor (VR-120, manufactured by Kokusai Denki System Service K.K.). The reduction in wafer thickness as a result of the polishing was determined from the wafer thickness measured before and after polishing. A polishing rate obtained by dividing the reduction in wafer thickness obtained in this way by the polishing time is shown in the "Polishing Rate" column of Table 4.

Copper patterned wafers were polished in accordance with the second polishing conditions using the polishing slurry "PLANERLITE-7102", manufactured by Fujimi Incorporated. Polishing was stopped when the copper film thickness of the polished copper patterned wafer had reached 70% of the copper film thickness of the copper patterned wafer prior to polishing. This process corresponds to the chemical mechanical polishing process of the first polishing process. Next, copper patterned wafers that had been subjected to the chemical mechanical polishing process of the first polishing process were polished in accordance with the first polishing conditions using the respective polishing compositions according to Examples 301 to 313 and Comparative Examples 301 to 315. Once an end point signal indicating that an upper surface of the barrier 14 was exposed had been detected, polishing was completed after further polishing only for the extra time it took to polish the copper film to a thickness of 200 nm. This process corresponds to the chemical mechanical polishing process of the second polishing process. The dishing depth d was then measured in the region in which wiring 17 had a width of 100 μm. The dishing depth was measured using the profiler HRP340 manufactured by KLA-Tencor Corporation, which is a contact-type surface measuring device. These measured results are shown in the "Dishing Depth" column of Table 4.

The amount of copper containing metal that remained on the insulting film 12 of the region wherein wiring 17 was not formed was measured for the copper patterned wafers that had been subjected to the chemical mechanical polishing process of the second polishing process. The remaining amount of copper containing metal was measured using an "OPTIPHOTO 300" differential interference microscope manufactured by Nikon Corporation. Based on the remaining amount of copper containing metal measured in this manner, each polishing composition was evaluated using the four grades of excellent (◎), good (○), acceptable (Δ), and poor (X). That is, cases where absolutely no copper containing metal residual could be seen were evaluated as excellent; cases where a small degree of patchy-shaped copper containing metal residue could be seen were evaluated as good; cases where patchy-shaped copper containing metal residue could be seen over the entire object were evaluated as good; cases where a large amount of copper containing metal remained over the entire object to such an extent that wiring could not be made out were evaluated as poor. These evaluation results are shown in the "Copper Containing Metal Residue Amount" column of Table 4.

Copper blanket wafers were polished in accordance with the first polishing conditions using both polishing compositions directly after they had been prepared, and polishing compositions that had been stored for some time after preparation in an airtight vessel. The respective polishing rate was calculated from the wafer thickness before and after polishing, whereby based on the comparison between the two calculated polishing rates, the pot life for each polishing composition was evaluated using the four grades of excellent (◎), good (○), acceptable (Δ), and poor (X). That is, cases where the polishing rate achieved using a polishing composition that had been stored for two weeks or more was greater than 90% of the polishing rate achieved using a polishing composition directly after being prepared were evaluated as excellent; cases where the polishing rate achieved using a polishing composition that had been stored for at least one week, but less than 2 weeks, was less than 90% of the polishing rate achieved using a polishing composition directly after being prepared were evaluated as good; cases where the polishing rate achieved using a polishing composition that had been stored for at least 3 days, but less than 1 week, was less than 90% of the polishing rate achieved using a polishing composition directly after being prepared were evaluated as acceptable; and cases where the polishing rate achieved using a polishing composition that had been stored for at less than 3 days, was less than 90% of the polishing rate achieved using a polishing composition directly after being prepared were evaluated as poor. These evaluation results are shown in the "Pot Life" column of Table 4.

TABLE 4

| | First Silicon Oxide [mass percentage] | Second Silicon Oxide [mass percentage] | Carboxylic Acid or Alpha-amino Acid [mass percentage] | Corrosion Inhibitor [mass percentage] | Surfactant [mass percentage] | | Oxidant [mass percentage] | pH | Polishing Rate [nm/min] | Dishing Depth [nm] | Copper Containing Metal Residue Amount | Pot Life |
|---|---|---|---|---|---|---|---|---|---|---|---|---|
| Ex. 301 | CS1 0.05% | CS3 0.25% | Ala 1% | G 0.01% | A 0.02% | D 0.015% | APS 1% | 9.5 | 550 | 15 | Δ | Δ |
| Ex. 302 | CS1 0.25% | CS3 0.25% | Ala 1% | G 0.01% | A 0.02% | D 0.015% | APS 1% | 9.5 | 600 | 20 | ○ | Δ |
| Ex. 303 | CS1 0.5% | CS3 0.25% | Ala 1% | G 0.01% | A 0.02% | D 0.015% | APS 1% | 9.5 | 600 | 20 | ○ | Δ |
| Ex. 304 | CS1 1% | CS3 0.25% | Ala 1% | G 0.01% | A 0.02% | D 0.015% | APS 1% | 9.5 | 600 | 20 | ○ | Δ |
| Ex. 305 | CS1 0.25% | CS3 0.05% | Ala 1% | G 0.01% | A 0.02% | D 0.015% | APS 1% | 9.5 | 550 | 15 | Δ | Δ |
| Ex. 306 | CS1 0.25% | CS3 0.5% | Ala 1% | G 0.01% | A 0.02% | D 0.015% | APS 1% | 9.5 | 600 | 20 | ○ | Δ |
| Ex. 307 | CS1 0.25% | CS3 1% | Ala 1% | G 0.01% | A 0.02% | D 0.015% | APS 1% | 9.5 | 600 | 25 | ○ | Δ |
| Ex. 308 | CS1 0.4% | CS3 0.1% | Ala 1% | G 0.01% | A 0.02% | D 0.015% | APS 1% | 9.5 | 600 | 15 | Δ | Δ |
| Ex. 309 | CS1 0.3% | CS3 0.2% | Ala 1% | G 0.01% | A 0.02% | D 0.015% | APS 1% | 9.5 | 600 | 20 | Δ | Δ |
| Ex. 310 | CS1 0.2% | CS3 0.3% | Ala 1% | G 0.01% | A 0.02% | D 0.015% | APS 1% | 9.5 | 600 | 20 | Δ | Δ |
| Ex. 311 | CS1 0.1% | CS3 0.4% | Ala 1% | G 0.01% | A 0.02% | D 0.015% | APS 1% | 9.5 | 600 | 25 | Δ | Δ |
| Ex. 312 | CS0 0.25% | CS3 0.25% | Ala 1% | G 0.01% | A 0.02% | D 0.015% | APS 1% | 9.5 | 550 | 20 | ○ | Δ |
| Ex. 313 | CS2 0.25% | CS3 0.25% | Ala 1% | G 0.01% | A 0.02% | D 0.015% | APS 1% | 9.5 | 680 | 30 | ○ | Δ |
| C. Ex. 301 | CS1 0.25% | — | Ala 1% | G 0.01% | A 0.02% | D 0.015% | APS 1% | 9.5 | 450 | 10 | X | Δ |
| C. Ex. 302 | CS1 0.5% | — | Ala 1% | G 0.01% | A 0.02% | D 0.015% | APS 1% | 9.5 | 500 | 10 | X | Δ |

TABLE 4-continued

| | First Silicon Oxide [mass percentage] | Second Silicon Oxide [mass percentage] | Carboxylic Acid or Alpha-amino Acid [mass percentage] | Corrosion Inhibitor [mass percentage] | Surfactant [mass percentage] | Oxidant [mass percentage] | pH | Polishing Rate [nm/min] | Dishing Depth [nm] | Copper Containing Metal Residue Amount | Pot Life |
|---|---|---|---|---|---|---|---|---|---|---|---|
| C. Ex. 303 | CS1 0.25% | CS2 0.25% | Ala 1% | G 0.01% | A 0.02% D 0.015% | APS 1% | 9.5 | 450 | 20 | Δ | Δ |
| C. Ex. 304 | CS0 0.25% | CS1 0.25% | Ala 1% | G 0.01% | A 0.02% D 0.015% | APS 1% | 9.5 | 300 | 20 | Δ | Δ |
| C. Ex. 305 | CS0 0.25% | CS2 0.25% | Ala 1% | G 0.01% | A 0.02% D 0.015% | APS 1% | 9.5 | 450 | 20 | Δ | Δ |
| C. Ex. 306 | CS2 0.25% | — | Ala 1% | G 0.01% | A 0.02% D 0.015% | APS 1% | 9.5 | 450 | 20 | Δ | Δ |
| C. Ex. 307 | CS2 0.5% | — | Ala 1% | G 0.01% | A 0.02% D 0.015% | APS 1% | 9.5 | 500 | 20 | Δ | Δ |
| C. Ex. 308 | — | CS3 0.25% | Ala 1% | G 0.01% | A 0.02% D 0.015% | APS 1% | 9.5 | 500 | 20 | Δ | Δ |
| C. Ex. 309 | — | CS3 0.5% | Ala 1% | G 0.01% | A 0.02% D 0.015% | APS 1% | 9.5 | 600 | 35 | Δ | Δ |
| C. Ex. 310 | — | CS4 0.25% | Ala 1% | G 0.01% | A 0.02% D 0.015% | APS 1% | 9.5 | 610 | 35 | ○ | Δ |
| C. Ex. 311 | — | CS4 0.5% | Ala 1% | G 0.01% | A 0.02% D 0.015% | APS 1% | 9.5 | 650 | 40 | ○ | Δ |
| C. Ex. 312 | CS0 0.25% | CS4 0.25% | Ala 1% | G 0.01% | A 0.02% D 0.015% | APS 1% | 9.5 | 600 | 35 | ○ | Δ |
| C. Ex. 313 | CS1 0.25% | CS4 0.25% | Ala 1% | G 0.01% | A 0.02% D 0.015% | APS 1% | 9.5 | 650 | 40 | ○ | Δ |
| C. Ex. 314 | CS2 0.25% | CS4 0.25% | Ala 1% | G 0.01% | A 0.02% D 0.015% | APS 1% | 9.5 | 700 | 45 | ○ | Δ |
| C. Ex. 315 | CS3 0.25% | CS4 0.25% | Ala 1% | G 0.01% | A 0.02% D 0.015% | APS 1% | 9.5 | 700 | 45 | ○ | Δ |

In the "[1]First Silicon Oxide" column and "Second Silicon oxide" column of Table 4:

CS0 is a colloidal silica wherein the 25% particle diameter D25 is 10 nm, the 50% particle diameter D50 is 20 nm, and the 75% particle diameter D75 is 33 nm;

CS1 is a colloidal silica wherein the 25% particle diameter D25 is 15 nm, the 50% particle diameter D50 is 30 nm, and the 75% particle diameter D75 is 50 nm;

CS2 is a colloidal silica wherein the 25% particle diameter D25 is 20 nm, the 50% particle diameter D50 is 50 nm, and the 75% particle diameter D75 is 72 nm;

CS3 is a colloidal silica wherein the 25% particle diameter D25 is 48 nm, the 50% particle diameter D50 is 70 nm, and the 75% particle diameter D75 is 95 nm; and CS4 is a colloidal silica wherein the 25% particle diameter D25 is 120 nm, the 50% particle diameter D50 is 160 nm and the 75% particle diameter D75 is 200 nm.

The 25% particle diameter. D25, 50% particle diameter D50, and 75% particle diameter D75 of the silicon dioxide were based on particle size distribution as measured using an N4 Plus Submicron Particle Sizer manufactured by Beckman Coulter, Inc. The total content of iron, nickel copper, chromium, zinc and calcium in a 20 mass % aqueous solution of colloidal silica was not more than 20 ppb.

In the "Carboxylic Acid or Alpha-amino Acid" column of Table 4, Ala denotes alanine.

In the "Corrosion Inhibitor" column of Table 4, G denotes 1-(2,3-dihydroxypropyl)benzotriazole.

In the "Surfactant" column of Table 4:

A denotes palm oil fatty acid sarcosine triethanolamine; and

D denotes polyoxyethylene lauryl ether sulfate triethanolamine.

In the "oxidant" column of Table 4, APS denotes ammonium persulfate.

As shown in Table 4, it was learned that in Examples 301 to 313, dishing depth is small and the occurrence of dishing is suppressed. It was also learned that the capability of the polishing composition according to Examples 301 to 313 to polish a copper containing metal is high.

The polishing compositions of Examples 308 to 312, wherein the content ratio of the second silicon oxide to the first silicon oxide was more than 0.25 and less than 4, could especially dramatically reduce dishing depth. On the other hand, the polishing compositions of Comparative Examples 308 to 312 had a polishing rate of 500 nm/minute or less, wherein the capability to polish a copper containing metal was low. Further, in the Comparative Examples 309 to 315, the dishing depth was a large 35 nm or more, whereby the occurrence of dishing could not be suppressed.

The invention claimed is:

1. A polishing composition to be used in polishing for forming wiring in a semiconductor device, the polishing composition comprising:

a surfactant;

a silicon oxide;

at least one selected from the group consisting of carboxylic acid and alpha-amino acid;

a corrosion inhibitor;

an oxidant; and water;

wherein said surfactant contains at least one selected from the compounds, each represented by any of general formulas (1) to (5), and the salts thereof,

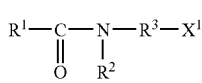 (1)

in general formula (1), $R^1$ represents an alkyl group having 8 to 16 carbon atoms, $R^2$ represents a hydrogen atom, a methyl group, or an ethyl group, $R^3$ represents an alkylene group having 1 to 8 carbon atoms, $-(CH_2CH_2O)_l-$, $-(CH_2CH(CH_3)O)_m-$, or a combination of at least two of those, l and m are integers of 1 to 8 when $R^3$ represents $-(CH_2CH_2O)_l-$ or $-(CH_2CH(CH_3)O)_m-$, the sum of l and m is 8 or less when $R^3$ represents the combination of $-(CH_2CH_2O)_l-$ and $-(CH_2CH(CH_3)O)_m-$, and $X^1$ represents a carboxy group or a sulfone group, and

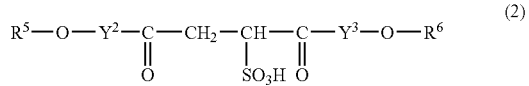 (2)

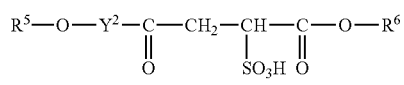 (3)

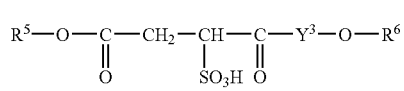 (4)

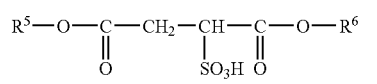 (5)

in general formulas (2) to (5), each of $R^5$ and $R^6$ represents a hydrogen atom, a hydroxy group, or an alkyl group having 8 to 16 carbon atoms, each of $Y^2$ and $Y^3$ represents $-(CH_2CH_2O)_q-$, $-(CH_2CH(CH_3)O)_r-$, or the combination of $-(CH_2CH_2O)_q-$ and $-(CH_2CH(CH_3)O)_r-$, q and r are integers of 1 to 6 when $Y^2$ or $Y^3$ represents $-(CH_2CH_2O)_q-$ or $-(CH_2CH(CH_3)O)_r-$, and the sum of q and r is an integer of 6 or less when $Y^2$ or $Y^3$ represents the combination of $-(CH_2CH_2O)_q-$ and $-(CH_2CH(CH_3)O)_r-$.

2. A polishing composition to be used in polishing for forming wiring in a semiconductor device, the polishing composition comprising:

a surfactant;

a silicon oxide;

at least one acid selected from the group consisting of carboxylic acid and alpha-amino acid;

a corrosion inhibitor;

an oxidant; and water;

wherein said surfactant contains at least one selected from the first group consisting of compounds, each represented by any of general formulas (1) to (5), and the salts thereof, and at least one selected from the second group consisting of compounds, each represented by any of general formulas (6) and (7), and the salt thereof,

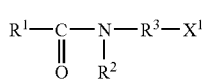 (1)

in general formula (1), $R^1$ represents an alkyl group having 8 to 16 carbon atoms, $R^2$ represents a hydrogen atom, a methyl group, or an ethyl group, $R^3$ represents an alkylene group having 1 to 8 carbon atoms, $-(CH_2CH_2O)_l-$, $-(CH_2CH(CH_3)O)_m-$, or a combination of at least two of those, l and m are integers of 1 to 8 when $R^3$ represents $-(CH_2CH_2O)_l-$ or $-(CH_2CH(CH_3)O)_m-$, the sum of l and m is 8 or less when $R^3$ represents the combination of $-(CH_2CH_2O)_l-$ and $-(CH_2CH(CH_3)O)_m-$, and $X^1$ represents a carboxy group or a sulfone group,

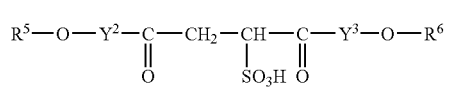 (2)

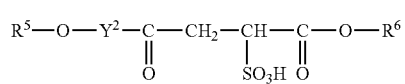 (3)

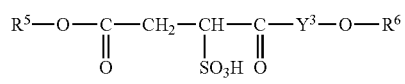 (4)

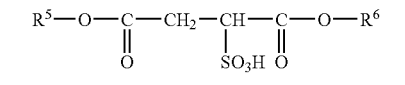 (5)

in general formulas (2) to (5), each of $R^5$ and $R^6$ represents a hydrogen atom, a hydroxy group, or an alkyl group having 8 to 16 carbon atoms, each of $Y^2$ and $Y^3$ represents $-(CH_2CH_2O)_q-$, $-(CH_2CH(CH_3)O)_r-$, or the combination of $-(CH_2CH_2O)_q-$ and $-(CH_2CH(CH_3)O)_r-$, q and r are integers of 1 to 6 when $Y^2$ or $Y^3$ represents $-(CH_2CH_2O)_q-$ or $-(CH_2CH(CH_3)O)_r-$, and the sum of q and r is an integer of 6 or less when $Y^2$ or $Y^3$ represents the combination of $-(CH_2CH_2O)_q-$ and $-(CH_2CH(CH_3)O)_r-$,

 (6)

in general formula (6) $R^7$ represents an alkyl group having 8 to 16 carbon atoms, $Y^4$ represents $-(CH_2CH_2O)_s-$, $-(CH_2CH(CH_3)O)_t-$, or the combination of $-(CH_2CH_2O)_s-$ and $-(CH_2CH(CH_3)O)_t-$, s and t are integers of 2 to 30 when $Y^4$ represents $-(CH_2CH_2O)_s-$ or $-(CH_2CH(CH_3)O)_t-$, and the sum of s and t is 30 or less when $Y^4$ represents the combination of $-(CH_2CH_2O)_s-$ and $-(CH_2CH(CH_3)O)_t-$, and

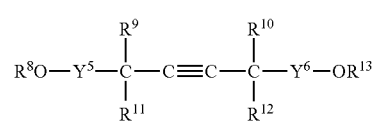 (7)

in general formula (7), each of $R^8$ to $R^{13}$ represents a hydrogen atom or an alkyl group having 1 to 10 carbon atoms, each of $Y^5$ and $Y^6$ represents $-(CH_2CH_2O)_u-$ or $-(CH_2CH(CH_3)O)_v-$, and u and v are integers of 1 to 20.

3. A polishing composition to be used in polishing for forming wiring in a semiconductor device, the polishing composition comprising:
a surfactant;
a silicon oxide;
at least one acid selected from the group consisting of carboxylic acid and alpha-amino acid;
a corrosion inhibitor;
an oxidant; and
wherein said surfactant contains at least one selected from the first group consisting of compounds, each represented by any of general formulas (1) to (5), and the salts thereof, and at least one selected from the second group consisting of compounds, each represented by any of general formulas (6) and (7), and the salt thereof,

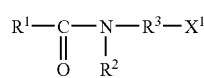 (1)

in general formula (1), $R^1$ represents an alkyl group having 8 to 16 carbon atoms, $R^2$ represents a hydrogen atom, a methyl group, or an ethyl group, $R^3$ represents an alkylene group having 1 to 8 carbon atoms, $-(CH_2CH_2O)_l-$, $-(CH_2CH(CH_3)O)_m-$, or a combination of at least two of those l and m are integers of 1 to 8 when $R^3$ represents $-(CH_2CH_2)O)_l-$ or $-(CH_2CH(CH_3O)_m-$, the sum of l and m is 8 or less when $R^3$ represents the combination of $-(CH_2CH_2O)_l-$ and $-CH_2CH(CH_3)O)_m-$, and $X^1$ represents a carboxy group or a sulfone group,

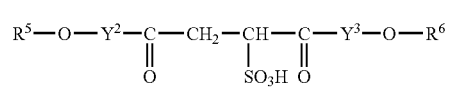 (2)

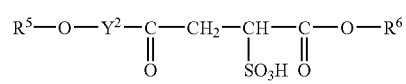 (3)

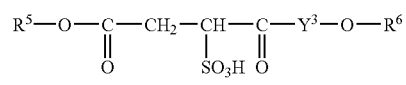 (4)

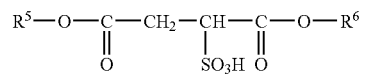 (5)

in general formulas (2) to (5) each of $R^5$ and $R^6$ represents a hydrogen atom, a hydroxy group, or an alkyl group having 8 to 16 carbon atoms, each of $Y^2$ and $Y^3$ represents $-(CH_2CH_2O)_q-$, $-(CH_2CH(CH_3)O)_r-$, or the combination of $-(CH_2CH_2O)_q-$ and $-(CH_2CH(CH_3)O)_r-$, q and r are integers of 1 to 6 when $Y^2$ $Y^3$ represents $-(CH_2CH_2O)_q-$ or $-(CH_2CH(CH_3)O)_r-$, and the sum of q and r is an integer of 6 or less when $Y^2$ or $Y^3$ represents the combination of $-(CH_2CH_2O)_q-$ and $-(CH_2CH(CH_3)O)_r-$, $$R^7-O-Y^4-SO_3H \qquad (6)$$

in general formula (6), $R^7$ represents an alkyl group having 8 to 16 carbon atoms, $Y^4$ reresents $-(CH_2CH_2O)_s-$, $-(CH_2CH(CH_3)O)_t-$, or the combination of $-(CH_2CH_2O)_s-$ and $-(CH_2CH(CH_3)O)_t-$, s and t are integers of 2 to 30 when $Y^4$ represents $-(CH_2CH_2O)_s-$ or $-(CH_2CH\ CH_3)O)_t-$, and the sum of s and t is 30 or less when $Y^4$ represents the combination of $-(CH_2CH_2O)_s-$ and $-(CH_2CH(CH_3)O)_t-$, and

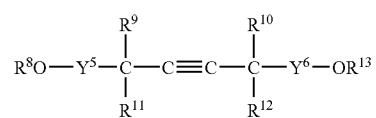 (7)

in general formula (7), each of $R^8$ to $R^{13}$ represents a hydrogen atom or an alkyl group having 1 to 10 carbon atoms, each of $Y^5$ and $Y^6$ represents $-(CH_2CH_2O)_u-$ or $-(CH_2CH(CH_3)O)_v-$, and u and v are integers of 1 to 20 wherein a mass ratio of the compound selected from the first group contained in said surfactant to the compound selected from the second group contained in said surfactant is 1/1 to 10/1.

4. The polishing composition according to claim 1, wherein the content of the surfactant in the polishing composition is 0.025 to 0.2 mass %.

5. The polishing composition according to claim 1, wherein said corrosion inhibitor is a benzotriazole derivative represented by general formula:

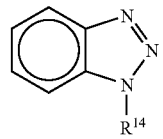

where $R^{14}$ represents an alkyl group having a carboxy group, an alkyl group having a hydroxy group and a tert-amino group, an alkyl group having a hydroxy group, or an alkyl group other than those.

* * * * *